US009711126B2

(12) United States Patent
Mehra et al.

(10) Patent No.: US 9,711,126 B2
(45) Date of Patent: Jul. 18, 2017

(54) METHODS, SYSTEMS, AND COMPUTER READABLE MEDIA FOR SIMULATING SOUND PROPAGATION IN LARGE SCENES USING EQUIVALENT SOURCES

(71) Applicant: The University of North Carolina at Chapel Hill, Chapel Hill, NC (US)

(72) Inventors: Ravish Mehra, Chapel Hill, NC (US); Dinesh Manocha, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 312 days.

(21) Appl. No.: 14/387,127

(22) PCT Filed: Mar. 14, 2013

(86) PCT No.: PCT/US2013/031619
§ 371 (c)(1),
(2) Date: Sep. 22, 2014

(87) PCT Pub. No.: WO2013/184215
PCT Pub. Date: Dec. 12, 2013

(65) Prior Publication Data
US 2015/0057083 A1 Feb. 26, 2015

Related U.S. Application Data

(60) Provisional application No. 61/614,468, filed on Mar. 22, 2012.

(51) Int. Cl.
*A63F 13/00* (2014.01)
*G10K 11/04* (2006.01)
(Continued)

(52) U.S. Cl.
CPC ............. *G10K 11/04* (2013.01); *A63F 13/54* (2014.09); *A63F 13/60* (2014.09); *A63F 2300/6081* (2013.01); *G06F 17/5009* (2013.01)

(58) Field of Classification Search
None
See application file for complete search history.

(56) References Cited

U.S. PATENT DOCUMENTS 6,259,452 B1 7/2001 Coorg et al.
6,751,322 B1 6/2004 Carlbom et al.
(Continued)

OTHER PUBLICATIONS

Svensson, "Software and measurement data for download," http://www.iet.ntnu.no/~svensson/software/index.html#EDGE (Jun. 30, 2016).

(Continued)

*Primary Examiner* — Paul A D'Agostino
(74) *Attorney, Agent, or Firm* — Jenkins, Wilson, Taylor & Hunt, P.A.

(57) ABSTRACT

The subject matter described herein includes an approach for wave-based sound propagation suitable for large, open spaces spanning hundreds of meters, with a small memory footprint. The scene is decomposed into disjoint rigid objects. The free-field acoustic behavior of each object is captured by a compact per-object transfer-function relating the amplitudes of a set of incoming equivalent sources to outgoing equivalent sources. Pairwise acoustic interactions between objects are cornuted analytically, yielding compact inter-object transfer functions. The global sound field accounting for all orders of interaction is computed using these transfer functions. The runtime system uses fast summation over the outgoing equivalent source amplitudes for all objects to auralize the sound field at a moving listener in real-time. We demonstrate realistic acoustic effects such as (Continued)

diffraction, low-passed sound behind obstructions, focusing, scattering, high-order reflections, and echoes, on a variety of scenes.

21 Claims, 8 Drawing Sheets

(51) Int. Cl.
  *A63F 13/54* (2014.01)
  *A63F 13/60* (2014.01)
  *G06F 17/50* (2006.01)

(56) References Cited

U.S. PATENT DOCUMENTS

| | | | | |
|---|---|---|---|---|
| 7,027,600 B1* | 4/2006 | Kaji | ............ | A63F 13/10 345/419 |
| 7,123,548 B1 | 10/2006 | Uzes | | |
| 7,319,760 B2* | 1/2008 | Sekine | ............ | H04S 7/30 381/17 |
| 7,394,904 B2* | 7/2008 | Bruno | ............ | H04S 3/02 381/18 |
| 7,480,386 B2* | 1/2009 | Ogata | ............ | G10L 21/00 381/306 |
| 7,643,377 B1 | 1/2010 | Uzes | | |
| 7,809,453 B2* | 10/2010 | Reichelt | ............ | H04S 3/008 381/182 |
| 7,930,048 B2* | 4/2011 | Reichelt | ............ | H04S 7/30 369/5 |
| 8,029,363 B2* | 10/2011 | Radek | ............ | G07F 17/32 463/35 |
| 8,133,117 B2* | 3/2012 | Ueda | ............ | A63F 13/10 463/35 |
| 8,214,179 B2 | 7/2012 | Carlbom et al. | | |
| 8,249,283 B2* | 8/2012 | Ando | ............ | H04S 7/308 381/17 |
| 8,466,363 B2* | 6/2013 | Tsuchida | ............ | A63F 13/54 381/1 |
| 8,615,090 B2* | 12/2013 | Son | ............ | H04S 3/002 381/306 |
| 8,847,965 B2 | 9/2014 | Chandak et al. | | |
| 9,113,280 B2* | 8/2015 | Cho | ............ | H04S 1/002 |
| 9,189,915 B2* | 11/2015 | Timperley | ............ | G07F 17/3202 |
| 9,560,439 B2 | 1/2017 | Mehra et al. | | |
| 2007/0036432 A1 | 2/2007 | Xu et al. | | |
| 2009/0262604 A1 | 10/2009 | Funada | | |
| 2011/0017545 A1 | 1/2011 | Pompei | | |
| 2011/0081023 A1 | 4/2011 | Raghuvanshi et al. | | |
| 2012/0007940 A1 | 1/2012 | Michrowski et al. | | |
| 2012/0016640 A1 | 1/2012 | Murphy | | |
| 2012/0249556 A1 | 10/2012 | Chandak et al. | | |
| 2013/0207976 A1 | 8/2013 | Jenkins | | |
| 2015/0294041 A1 | 10/2015 | Yeh et al. | | |
| 2015/0326966 A1 | 11/2015 | Mehra et al. | | |
| 2015/0378019 A1 | 12/2015 | Schissler et al. | | |
| 2016/0034248 A1 | 2/2016 | Schissler et al. | | |

OTHER PUBLICATIONS

"Interactive 3D Audio Rendering Guidelines—Level 2.0," Interactive Audio Special Interest Group, pp. 1-29 (Sep. 20, 1999).
Ahrens, "Wave Field Synthesis of a Sound Field Described by Spherical Harmonics Expansion Coeficients," The Journal of the Acoustical Society of America, vol. 131, No. 3, pp. 2190-2199 (Mar. 2012).
Algazi et al., "The CIPIC HRTF Database," Applications of Signal Processing to Audio and Acoustics, 2001 IEEE Workshop, pp. 99-102 (Oct. 21-24, 2001).
Boyd, "Chebyshev and Fourier Spectral Methods: Second Revised Edition," 2 Revised ed. Dover Publications (Dec. 2001).
Chadwick et al., "Harmonic Shells: A Practical Nonlinear Sound Model for Near-Rigid Thin Shells," ACM SIGGRAPH Asia 2009 papers, pp. 119:1-119:10 (2009).
CLF, "CLF: Common Loudspeaker Format," (date last viewed Oct. 21, 2012). http://www.clfgroup.org/.
Duraiswami et al., "High Order Spatial Audio Capture and its Binaural Head-Tracked Playback over Headphones with HRTF Cues," 119th Audio Engineering Society Convention, pp. 1-16 (Oct. 7-10, 2005).
FastBEM Acoustics, www.fastbem.com, Advanced CAE Research, LLC, Cincinnati, Ohio (2007-2015).
Giron, "Investigations about the Directivity of Sound Sources: Dissertation," Berichte aus der Elektrotechnik. Shaker (1996).
Green, "Spherical Harmonic Lighting: The Gritty Details," Archives of the Game Developers Conference, pp. 1-47 (Jan. 16, 2003).
Hacihabiboğlu et al., "Time-Domain Simulation of Directive Sources in 3-D Digital Waveguide Mesh-Based Acoustical Models," IEEE Transactions on Audio, Speech, and Language Processing, vol. 16, No. 5, pp. 934-946 (Jul. 2008).
IASIG, "Interactive audio special interest group : Interactive 3d audio rendering guidelines, level 2.0," (1999).
James et al., "Precomputed Acoustic Transfer: Output-Sensitive, Accurate Sound Generation for Geometrically Complex Vibration Sources," ACM SIGGRAPH, vol. 25, No. 3, pp. 987-995 (Jul. 2006).
Kino, "Acoustic Waves: Devices, Imaging, and Analog Signal Processing," Prentice Hall Signaling Processing Series, pp. 1-625 (1987).
Liu, "Fast Multipole Boundary Element Method: Theory and Applications in Engineering," Cambridge, pp. 119:1-119:10 (2009).
Malham, "Higher Order Ambisonic Systems for the Spatialization of Sound,"ICMC Proceedings, pp. 484-487 (1999).
Menzies et al., "Ambisonic Synthesis of Complex Sources," J. Audio Eng. Soc. vol. 55, No. 10, pp. 864-876 (2007).
Meyer et al., "Acoustics and the Performance of Music," Manual for Acousticians, Audio Engineers, Musicians, Architects and Musical Instruments Makers, pp. 1-447 (2009).
Meyer, "A Highly Scalable Spherical Microphone Array Based on an Orthonormal Decomposition of the Soundfield," ICASSP, vol. 2, pp. II-1781-II-1784 (2002).
Otondo et al., "The Influence of the Directivity of Musical instruments in a Room," Acta Acustica United with Acustica, vol. 90, No. 6, pp. 1178-1184 (2004).
Pelzer et al., "Auralization of a Virtual Orchestra Using Directivities of Measured Virtual Orchestra Using Directivites of Measured Symphonic Instruments," Proceedings of the Acoustics 2012 Nantes Conference, pp. 2379-2384 (Apr. 23-27, 2012).
Rafaely et al., "Interaural Cross Correlation in a Sound Field Represented by Spherical Harmonics," The Journal of the Acoustical Society of America, vol. 127, No. 2, pp. 823-828 (Feb. 2010).
Vigeant, "Investigations of Incorporating Source Directivity into Room Acoustics Computer Models to Improve Auralizations," The Journal of the Acoustical Society of America, vol. 124, No. 5, pp. 2664-2664 (2008).
Ward et al., "Reproduction of a Plane-Wave Sound Field Using an Array of Loudspeakers," IEEE Transactions on Speech and Audio Processing, vol. 9, No. 6, pp. 697-707 (Sep. 2001).
Zheng et al., "Harmonic Fluids," ACM SIGGRAPH 2009 papers, pp. 37:1-37:12 (2009).
Zheng et al., "Rigid-Body Fracture Sound with Precomputed Soundbanks," ACM SIGGRAPH, pp. 69:1-69:13 (2010).
Zotkin et al., "Plane-Wave Decomposition of Acoustical Scenes Via Spherical and Cylindrical Microphone Arrays," IEEE Transactions on Audio, Speech, and Language Processing, vol. 18, No. 1, pp. 2-16 (Jan. 2010).
Notice of Allowance and Fee(s) Due for U.S. Appl. No. 13/373,901 (May 28, 2014).
Final Office Action for U.S. Appl. No. 13/373,901 (Jan. 14, 2014).
Non-Final Office Action for U.S. Appl. No. 13/373,901 (Sep. 11, 2013).
Abramowitz et al, "Handbook of Mathematical Functions," 5th ed. Dover, New York (1964).
Akenine-Moller et al., "Conservative and Tiled Rasterization Using a Modified Triangle Setup," Journal of Graphics Tools, vol. 10, No. 3, pp. 1-7 (2005).

(56) References Cited

OTHER PUBLICATIONS

Alarcao, et al., "An auralization system for real time room acoustics simulation," Proceedings of Tecniacustica, (2009).
Allen. et al., "Image method for efficiently simulating small-room acoustics," The Journal of the Acoustical Society of America, vol. 65, Issue 4 (Apr.), pp. 943-950, (1979).
Antani, et al., "Aural proxies and directionally-varying reverberation for interactive sound propagation in virtual environments," Visualization and Computer Graphics, IEEE Transactions, vol. 19, Issue 4, pp. 218-233, (2013).
Antani, et al., "Efficient finite-edge diffraction using conservative from-region visibility," Applied Acoustics, vol. 73, pp. 218-233, (2012).
Antani et al., "Direct-to-Indirect Acoustic Radiance Transfer," IEEE Transactions on Visualization and Computer Graphics, vol. 18, No. 2, pp. 261-269 (Feb. 2012).
Antani et al., "Interactive Sound Propagation Using Compact Acoustic Transfer Operators," ACM Transactions on Graphics, vol. 31, No. 1, Article 7, pp. 7:1-7:12 (Jan. 2012).
Antonacci et al., "Fast Modeling of Acoustic Reflections and Diffraction in Complex Environments Using Visibility Diagrams," Proceedings of 12th European Signal Processing Conference, pp. 1773-1776 (2004).
Aretz, "Combined Wave and Ray Based Room Acoustic Simulations of Small Rooms: Challenges and limitations on the way to realistic simulation results," Ph.D. Thesis, Aachener Beiträge zur Technischen Akustik (Sep. 2012).
Arfken, George B. and Weber, Hans J., "Essential Mathematical Methods for Physicists," (1985).
Arvo et al., "A Survey of Ray Tracing Acceleration Techniques," An Introduction to Ray Tracing, pp. 201-262 (1989).
Barbone et al., "Scattering by a hybrid asymptotic/finite element method," Computer Methods in Applied Mechanics and Engineering, vol. 164, No. 1, pp. 141-156 (1998).
Battenberg et al., "Implementing Real-Time Partitioned Convolution Algorithms on Conventional Operating Systems," Proceedings of the 14th International Conference on Digital Audio Effects, Paris, France (2011).
Begault, "3-D Sound for Virtual Reality and Multimedia," NASA/TM-2000-000000, pp. 1-246 (Apr. 2000).
Ben-Artzi et al., "A Precomputed Polynomial Representation for Interactive BRDF Editing with Global Illumination," ACM Transactions on Graphics, pp. 1-10 (2008).
Bertram, et al., "Phonon tracing for auralization and visualization of sound," Proceedings of IEEE Visualization, pp. 151-158, (2005).
Biot et al., "Formulation of Wave Propagation in Infinite Media by Normal Coordinates with an Application to Diffraction," The Journal of the Acoustical Society of America, vol. 29, No. 3, pp. 381-391 (Mar. 1957).
Bittner et al., "Adaptive Global Visibilty Sampling," SIGGRAPH '09: ACM SIGGRAPH, pp. 1-10 (2009).
Bittner et al., "Fast Exact From-Region Visibility in Urban Scenes," Eurographics Symposium on Rendering, pp. 1-9 (2005).
Bittner et al., "Hierarchical Visibility Culling with Occlusion Trees," Proceedings of Computer Graphics International, pp. 207-219 (Jun. 1998).
Bittner et al., "Visibility in Computer Graphics," Environment and Planning B: Planning and Design, vol. 30, pp. 729-756 (2003).
Blauert, "Spatial Hearing: The Psychophysics of Human Sound Localization," MIT Press, pp. 334-335 (1983).
Borish, J., "Extension to the image model to arbitrary poly-hedra," The Journal of the Acoustical Society of America, vol. 75, Issue 6 (June), pp. 1827-1836, (1984).
Calarnia et al., "Edge Subdivision for Fast Diffraction Calculations," 2005 IEEE Workshop on Applications of Signal Processing to Audio and Acoustics, pp. 187-190 (2005).
Calamia at al., "Fast Time-Domain Edge-Diffraction Calculations for Interactive Acoustic Simulations," EURASIP Journal on Advances in Signal Processing, vol. 2007, Article 63560, pp. 1-33 (2007).
Calamia et al., "Integration of edge diffraction calculations and geometrical-acoustics modeling," Proceedings of Forum Acusticum, pp. 1-6 (2005).
Case, K, "Structural Acoustics: a General Form of Reciprocity Principles in Acoustics," Technology Reports, JSR-92-193, The MITRE Corporation (Jan. 1993).
Chambers et al., "Time-domain experiments on the diffraction of sound by a step discontinuity," Journal of the Acoustical Society of America, vol. 96, No. 3, pp. 1887-1892 (Sep. 1994).
Chandak et al., "AD-Frustum: Adaptive Frustum Tracing for Interactive Sound Propagation," IEEE Transactions on Visualization and Computer Graphics, vol. 14, No. 6, pp. 1707-1714 (Nov./Dec. 2008).
Chandak et al., "FastV: From-point visibility culling on complex models," Computer Graphics Forum (Proc. of EGSR), vol. 28, Issue 3, pp. 1237-1247, (2009).
Cheng et al., "Heritage and Early History of the Boundary Element Method," Engineering Analysis with Boundary Elements, vol. 29, No. 3, pp. 268-302 (Mar. 2005).
Chhugani et al., "vLOD: High-Fidelity Walkthrough of Large Virtual Environments," IEEE Transactions on Visualization and Computer Graphics, vol. 11, No. 1, pp. 35-47 (Jan./Feb. 2005).
Christensen et al., Odeon Manual, Chapter 6 (2013).
Christensen et al., "A New Scattering Method that Combines Roughness and Diffraction Effects," Forum Acousticum, Budapest, Hungary (2005).
Christensen et al., "Danish Acoustical Society Round Robin on Room Acoustic Computer Modeling," Odeon A/S: Lyngby, Denmark (2008).
Cohen-Or et al., "A Survey of Visibility for Walkthrough Applications," IEEE Transactions on Visualization and Computer Graphics, vol. 9, No. 3, pp. 412-431 (Jul.-Sep. 2003).
Coorg et al., "Real-Time Occlusion Culling for Models with Large Occluders," Symposium on Interactive 3D Graphics, pp. 83-90 (Apr. 1997).
Dalenback, "Room acoustic prediction based on a unified tretment of diffuse and specular reflection," The Journal of the Acoustical Society of America, vol. 100, No. 2, Pt. 1, pp. 899-909 (Aug. 1996).
Dalenbäck et al., "A Macroscopic View of Diffuse Reflection," J. Audio Eng. Soc., vol. 42, No. 10, pp. 793-807 (Oct. 1994).
Doicu et al, "Acoustic and Electromagnetic Scattering Analysis Using Discrete Sources," 1st ed. Academic Press (Jul. 2000).
Duguet et al., "Robust Epsilon Visibility," Proc. of ACM SIGGRAPH, pp. 567-575 (2002).
Durand et al., "Conservative Visibility Preprocessing Using Extended Projections," SIGGRAPH '00: Proceedings of the 27th Annual Conference on Computer Graphics and Interactive Techniques, pp. 1-13 (2000).
Durand, "3D Visibility: Analytical Study and Applications," pp. 1-305 (1999).
Durand et al.,"The 3d visibility complex: a new approach to the problems of accurate visibility," Proceedings of the Eurographics Workshop on Rendering Techniques '96, pp. 245-256 (1996).
Durand et al., "The Visibility Skeleton: A Powerful and Efficient Multi-Purpose Global Visibility Tool," SIGGRAPH '97: Proceedings of the 24th Annual Conference on Computer Graphics and Interactive Techniques, pp. 89-100 (1997).
Embrechts, et al. "Broad spectrum diffusion model for room acoustics ray-tracing algorithms," The Journal of the Acoustical Society of America, vol. 107, issue 4, pp. 2068-2081, (2000).
Eyring, C. F, "Reverberation time in "dead" rooms," The Journal of the Acoustical Society of America, vol. 1, Issue 2A (January), pp. 217-241, (1930).
Fairweather et al., "The Method of Fundamental Solutions for Scattering and Radiation Problems," Engineering Analysis with Boundary Elements, vol. 27, No. 7, pp. 759-769 (Jul. 2003).
Fouad et al., "Perceptually Based Scheduling Algorithms for Real-Time Synthesis of Complex Sonic Environments," Proceedings of International Conference on Auditory Display (1997).
Franzoni, et al., "An acoustic boundary element method based on energy and intensity variables for prediction of high-frequency broadband sound fields," The Journal of the Acoustical Society of America, vol. 110, Article 3071, (2001).

(56) References Cited

OTHER PUBLICATIONS

Funkhouser, et al., "A beam tracing approach to acoustic modeling for interactive virtual environments," Proceedings of ACM SIGGRAPH, pp. 21-32, (1998).
Funkhouser et al., "Survey of Methods for Modeling Sound Propagation in Interactive Virtual Environment Systems," Presence, pp. 1-53 (2004).
Funkhouser et al., "A beam tracing method for interactive architectural acoustics," Journal of Acoustical Sociaty of America, vol. 115, No. 2, pp. 739-756 (Feb. 2004).
Gallo et al., "Efficient 3D Audio Processing on the GPU," ACM Workshop on General Purpose Computing on Graphics Processors (2004).
Garland, et al., "Surface simplification using quadric error metrics," Proceedings of the 24th annual conference on Computer graphics and interactive techniques, ACM Press/Addison-Wesley Publishing Company, pp. 209-216, (1997).
Geringer et al., "High School String Players Perception of Violin, Trumpet, and Voice Intonation," String Research Journal, vol. 3, pp. 81-96 (2012).
Ghali, "A Survey of Practical Object Space Visibility Algorithms," SIGGRAPH, pp. 1-14 (2001).
Gigus et al., "Efficiently Computing and Representing Aspect Graphs of Polyhedral Objects," IEEE Transactions on Pattern Analysis Machine Intelligence, vol. 13, No. 6, pp. 542-551 (Jun. 1991).
Griesinger, David, "The Importance of the Direct to Reverberant Ratio in the Perception of Distance, Localization, Clarity and Envelopment," Audio Engineering Society Convention, vol. 126, Audio Engineering Society (2009).
Gurnerov et al., "A Broadband Fast Multipole Accelerated Boundary Element Method for the 3D Helmholtz Equation," The Journal of the Acoustical Society of America, vol. 125, No. 1, pp. 1-46 (2008).
Hampel et al., "Coupling boundary elements to a raytracing procedure," International Journal for Numerical Methods in Engineering, vol. 73, No. 3, pp. 427-445 (2008).
Hasenfratz et al., "A Survey of Real-Time Soft Shadows Algorithms," Eurographics, vol. 22, No. 4, pp. 753-774 (2003).
Heckbert et al., "Beam Tracing Polygonal Objects," Proc. of ACM SIGGRAPH, pp. 1-23 (1984).
Huang, et al., "An accurate method for voxelizing polygon meshes," Volume Visualization, 1998. IEEE Symposium on, IEEE, pp. 119-126, (1998).
Hudson et al., "Accelerated Occlusion Culling using Shadow Frusta," Proc. of ACM Symposium on Computational Geometry, pp. 1-10 (1997).
James, et al., "Precomputed acoustic transfer: output-sensitive, accurate sound generation for geometrically complex vibration sources," Proceedings of ACM SIGGRAPH, pp. 987-995, (2006).
Jean et al., "Calculation of Tyre Noise Radiation with a Mixed Approach," Acta Acustica united with Acustica, vol. 94, No. 1, pp. 1-6 (2008).
Kajiya, "The Rendering Equation," Proc. of ACM SIGGRAPH, vol. 20, No. 4, pp. 143-150 (1986).
Kapralos et al., "Sone Mapping: Acoustic Modeling Utilizing an Acoustic Version of Photon Mapping," IEEE International Workshop on Haptics Audio Visual Environments and their Applications, pp. 2-3 (2004).
Klosowski et al., "The Prioritized-Layered Projection Algorithm for Visible Set Estimation," IEEE Transactions on Visualization and Computer Graphics, vol. 6, No. 2, pp. 108-123 (Apr.-Jun. 2000).
Koltun et al., "Hardware-accelerated from-region visibility using a dual ray space," Proceedings of the 12th Eurographics Workshop on Rendering Techniques, pp. 205-216 (2001).
Koltun et al., "Virtual Occluders: An Efficient Intermediate PVS Representation," Eurographics Workshop on Rendering, pp. 1-12 (2000).
Koltun et al., "Selecting Effective Occluders for Visibility Culling," Eurographics , pp. 1-5 (2000).

Kouyoumjian, et al., "A uniform geometrical theory of diffraction for an edge in a perfectly conducting surface," Proceedings of the IEEE, vol. 62, Issue 11, pp. 1448-1461, (1974).
Krivanek, et al., "Practical Global Illumination with Irradiance Caching," ACM SIGGRAPH Course Notes, (2008).
Krokstad, et al., "Calculating the acoustical room response by the use of a ray tracing technique," Journal of Sound and Vibration, vol. 8, Issue 1 (Jul.), pp. 118-125, (1968).
Kulp, Barry D., "Digital Equalization Using Fourier Transform Techniques," Audio Engineering Society Convention, vol. 85, Audio Engineering Society (1988).
Kuttruff, H., "A simple iteration scheme for the computation of decay constants in enclosures with diffusely reflecting boundaries," The Journal of the Acoustical Society of America, vol. 98, Issue 1, pp. 283-293, (1995).
Laine et al., "Accelerated beam tracing algorithm," Applied Acoustics, No. 70, pp. 172-181 (2009).
Laine, "An Incremental Shaft Subdivision Algorithm for Computing Shadows and Visibility," Master's Thesis, Helsinki University of Technolooy (Mar. 29, 2006).
Lauterbach et al., "Adaptive sampling for frustum-based sound propagation in complex and dynamic environments," Proceedings of the 19th International Congress on Acoustics, pp. 1-6 (Sep. 2007).
Lauterbach et al., "Interactive Sound Rendering in Complex and Dynamic Scenes sing Frustum Tracing," IEEE Transactions on Visualization and Computer Graphics, vol. 13, No. 6, pp. 1672-1679 (Nov.-Dec. 2007).
Law et al., "Preprocessing Occlusion for Real-Time Selective Refinement," 1999 Symposium on Interactive 3D Graphics, pp. 47-53 (1999).
Lehnert, "Systematic Errors of the Ray-Tracing Algorithm," Applied Acoustics, vol. 38, pp. 207-221 (1993).
Lehtinen, "Time-domain Numerical Solution of the Wave Equation," pp. 1-17 (Feb. 6, 2003).
Lensch et al., "FastV: From-point Visibility Culling on Complex Models," Eurographics Symposium on Rendering, vol. 28, No. 4, pp. 1-8 (2009).
Lentz, et al., "Virtual reality system with integrated sound field simulation and reproduction," EURASIP Journal on Advances in Signal Processing 2007 (January), pp. 187-187, (2007).
Leyvand et al., "Ray Space Factorization for From-Region Visibility," ACM Transactions on Graphics, pp. 595-604 (Jul. 2003).
Liu et al, "Development of the Fast Multipole Boundary Element Method for Acoustic Wave Problems," Recent Advances in Boundary Element Methods, pp. 287-303 (2009).
Lloyd et al., "Warping and Partitioning for Low Error Shadow Maps," Proceedings of the Eurographics Symposium on Rendering, pp. 1-13 (2006).
Lokki et al., "Studies of Epidaurus with a Hybrid Room Acoustics Modelling Method," In the Acoustics of Ancient Theatres Conference, Greece, pp. 1-6 (Sep. 2011).
Lorensen, et al., "Marching cubes: A high resolution 3d surface construction algorithm," ACM Siggraph Computer Graphics, vol. 21, ACM, pp. 163-169, (1987).
Luebke et al., "Portals and Mirrors: Simple, Fast Evaluation of Potentially Visibile Sets," ACM Interactive 3D Graphics Conference, pp. 105-108 (1995).
Mattausch et al., "CHC++: Coherent Hierarchical Culling Revisited," Proc. of Eurographics Workshop on Rendering, vol. 27, No. 3, pp. 221-230 (2008).
Medwin et al., "Impulse studies of double diffraction: A discrete Huygens interpretation," The Journal of the Acoustical Society of America, pp. 1005-1013 (Sep. 1982).
Mehra, et al., "Wave-based sound propagation in large open scenes using an equivalent source formulation," ACM Transactions on Graphics, vol. 32, Issue 2, pp. 19:1-19:13, (2013).
Moeck, et al., "Progressive perceptual audio rendering of complex scenes," Proceedings of Symposium on Interactive 3D graphics and games, ACM, pp. 189-196, (2007).
Müller-Tomfelde, Christian, "Time-Varying Filter in Non-Uniform Block Convolution," Proceedings of the COST G-6 Conference on Digital Audio Effects (2001).

(56) References Cited

OTHER PUBLICATIONS

Murphy et al., "Hybrid Room Impulse Response Synthesis in Digital Waveguide Mesh Based Room Acoustics Simulation," In Proceedings of the 11th International Conference on Digital Audio Effects (DAFx-08), pp. 1-8 (Sep. 2008).
Navazo et al., "ShieldTester: Cell-to-cell visibility test for surface occluders," Proc. of Eurographics, pp. 291-302 (2003).
Nirenstein et al., "Exact From-Region Visibility Culling," Thirteenth Eurographics Workshop on Rendering, pp. 191-202 (2002).
Nirenstein et al., "Hardware Accelerated Visibility Preprocessing using Adaptive Sampling," Eurographics Symposium on Rendering (2004).
Nirenstein, "Fast and Accurate Visibility Preprocessing," Dissertation, University of Cape Town, South Africa (2003).
Nironen, H, "Diffuse Reflections in Room Acoustics Modelling," PhD thesis, Helsinki University of Technology, (2004).
Nooruddin, et al., "Simplification and repair of polygonal models uing volumetric techniques," Visualization and Computer Graphics, IEEE Transactions, vol. 9, Issue 2, pp. 191-205, (2003).
"Nvidia occlusion query," http://oss.sgi.com/projects/ogl-sample/registry/NV/occlusion_query.txt (2002).
Overbeck et al., "A Real-time Beam Tracer with Application to Exact Soft Shadows," Eurographics Symposium on Rendering, pp. 85-98 (Jun. 2007).
Owens et al., "A Survey of General-Purpose Computation on Graphics Hardware," Computer Graphics Forum, vol. 26, No. 1, pp. 80-113 (2007).
Pelzer, et al., "Frequency-and time-dependent geometry for real-time auralizations," Proceedings of 20th International Congress on Acoustics, ICA, (2010).
Pierce, "Acoustics: An Introduction to its Physical Principles and Applications," The Journal of the Acoustical Society of America, vol. 70(5), p. 1548 (1981).
Pulkki et al, "Implementation and visualization of edge diffraction with image source method," In Proceedings of the 112th AES Convention, pp. 1-13 (May 10-13, 2002).
Pulkki et al., "Visualization of edge diffraction," Acoustics Research Letters Online, vol. 4, No. 4, pp. 118-123 (2002).
Raghuvanshi et al., "Accelerated Wave-Based Acoustics Simulation," SPM '08: Proceedings of the 2008 ACM Symposium on Solid and Physical Modeling, pp. 91-102 (2008).
Raghuvanshi et al., "Efficient and Accurate Sound Propagation Using Adaptive Rectangular Decomposition," IEEE Transactions on Visualization and Computer Graphics, vol. 15, No. 5, pp. 789-801 (2009).
Raghuvanshi, et al., "Precomputed wave simulation for real-time sound propagation of dynamic sources in complex scenes," ACM Transactions on Graphics, vol. 29, Issue 4, pp. 68:1-68:11, (2010).
Reshetov et al., "Multi-Level Ray Tracing Algorithm," ACM Trans. Graph., pp. 1176-1185 (2005).
Rindel, et al., "Room Acoustic Simulation and Auralization—How Close can we get to the Real Room?," Proceedings of 8th Western Pacific Acoustics Conference, Melbourne (2003).
Savioja, et al., "Auralization Applying the Parametric Room Acoustic Modeling Technique—The Diva Auralization System," 8th International Conference on Auditory Display, pp. 219-224, (2002).
Savioja, L, "Real-Time 3D Finite-Difference Time-Domain Simulation of Mid-Frequency Room Acoustics," 13th International Conference on Digital Audio Effects, DAFx-10, (2010).
Schaufler el al., "Conservative Volumetric Visibility with Occluder Fusion," SIGGRAPH 2000, Computer Graphics Proceedings, pp. 229-238 (2000).
Schissler, et al., "Gsound: Interactive sound propagation for games," AES 41st International Conference: Audio for Games, (2011).
Schissler et al., "High-Order Diffraction and Diffuse Reflections for Interactive Sound Propagation in Large Environments," ACM Transactions on Graphics (SIGGRAPH 2014), vol. 33, Issue 4, Article 39 (2014).

Schröder, Dirk, "Physically Based Real-Time Auralization of Interactive Virtual Environments", vol. 11, Logos Verlag Berlin GmbH (2011).
Schroder et al., "Real-Time Hybrid Simulation Method Including Edge Diffraction," Proc. of the EAA Symposium on Auralization, pp. 1-6 (Jun. 15-17, 2009).
Schröder et al., "Real-Time Processing of image Sources Using Binary Space Partitioning," Journal of the Audio Engineering Society, vol. 54, No. 7/8, pp. 604-619 (Jul./Aug. 2006).
Schroeder, M.R., "Natural sounding artificial reverberation," Journal of the Audio Engineering Society, vol. 10, Issue 3, pp. 19-223, (1962).
Shirley et al., "State of the Art in Interactive Ray Tracing," SIGGRAPH Course Notes (2006).
Shoemake, "Pluecker Coordinate Tutorial," Ray Tracing News 11 (1998).
Siltanen et al., "Frequency Domain Acoustic Radiance Transfer for Real-Time Auralization," Acta Acustica United with Acustica, vol. 95, pp. 106-117 (2009).
Siltanen, et al., "The Room Acoustic Rendering Equation," The Journal of the Acoustical Society of America, vol. 122, No. 3, pp. 1624-1635 (2007).
Siltanen, et al., "Geometry reduction in room acoustics modeling," Acta Acustica united with Acustica, vol. 94, Issue 3, pp. 410-418, (2008).
Svensson et al., "Edge-Diffraction Impulse Responses Near Specular-Zone and Shadow-Zone Boundaries," Acta Acustica United with Acustica, vol. 92, pp. 501-512 (2006).
Svensson et al., "Computational Modelling and Simulation of Acoustic Spaces," AES 22nd International Conference on Virtual, Synthetic and Entertainment Audio, pp. 1-20 (2002).
Svensson, et al., "An analytic secondary source model of edge diffraction impulse responses," Acoustical Society of America Journal, vol. 106, Issue 5 (Nov.), pp. 2331-2344, (1999).
Svensson, "Edge Diffraction Toolbox," pp. 1-2 (1999).
Taflove et al, "Computational Electrodynamics: The Finite-Difference Time-Domain Method, Third Edition," 3rd ed. Artech House Publishers, London, UK and Boston, USA, ch. 1,4 (Jun. 2005).
Taylor, et al., "Guided multiview ray tracing for fast auralization," IEEE Transactions on Visualization and Computer Graphics, vol. 18, Issue 11 (Nov.), pp. 1797-1810, (2012).
Taylor et al., "iSound: Interactive GPU-based Sound Auralization in Dynamic Scenes," Techincal Report TR 10-006, University of North Carolina at Chapel Hill, pp. 1-10 (2010).
Taylor et al., "Fast Edge-Diffraction for Sound Propagation in Complex Virtual Environments," EAA Auralization Symposium, pp. 1-6 (Jun. 2009).
Taylor, el al., "Resound: interactive sound rendering for dynamic virtual environments," MM '09: Proceedings of the seventeen ACM international conference on Multimedia, ACM, pp. 271-280, (2009).
Teller et al., "Computing the Antipenumbra of an Area Light Source," SIGGRAPH '92: Proceedings of the 19th Annual Conference on Computer Graphics and interactive Techniques, pp. 139-148 (1992).
Teller et al., "Visibility Preprocessing for Interactive Walkthroughs," SIGGRAPH Comput. Graph., pp. 61-70 (1991).
Teller, "Visibility Computations in Densely occluded Polyheral Environments," PhD thesis, CS Division, UC Berkeley (1992).
Theoharis et al., "The Magic of the Z-Buffer: A Survey," Proc. of 9th International Conference on Computer Graphics, Visualization and Computer Vision, WSCG (2001).
Thompson, L. L., "A review of finite-element methods for time-harmonic acoustics," Journal of the Acoustical Society of America, vol. 119, Issue 3 (March), pp. 1315-1330, (2006).
Torres et al., "Computation of edge diffraction for more accurate room acoustics auralization," The Journal of the Acoustical Society of America, pp. 600-610 (2001).
Tsingos, et al., "Instant sound scattering," Proceedings of the Eurographics Symposium on Rendering, pp. 111-120, (2007).
Tsingos, et al., "Modeling acoustics in virtual environments using the uniform theory of diffraction," SIGGRAPH 2001, Computer Graphics Proceedings, pp. 545-552, (2001).

(56) References Cited

OTHER PUBLICATIONS

Tsingos, et al.. "Perceptual audio rendering of complex virtual environments," Tech. Rep. RR-4734, INRIA, REVES/INRIA Sophia-Antipolis, Feb. 2003.
Tsingos, Nicholas. "A Versatile Software Architecture for Virtual Audio Simulations," International Conference on Auditory Display (ICAD) (2001).
Tsingos, et al., "Pre-computing geometry-based reverberation effects for games," 35th AES Conference on Audio for Games, pp. 1-10, (2009).
Tsingos et al., "A General Model for the Simulation of Room Acoustics Based on Hierarchical Radiosity," ACM SIGGRAPH 97, pp. 1-2 (1997).
Valimaki et al., "Fifty Years of Artificial Reverberation," IEEE Transactions on Audio, Speech, and Language Processing, vol. 20, issue 5, pp. 1421-1448, (2012).
Vorlander, M. "Simulation of the transient and steady-state sound propagation in rooms using a new combined ray-tracing/image-source algorithm," The Journal of the Acoustical Society of America, vol. 86, Issue 1, pp. 172-178, (1989).
Wald et al., "State of the Art in Ray Tracing Dynamic Scenes," Eurographics State of the Art Reports, pp. 1-28 (2007).
Wand, M, et al., "Multi-resolution sound rendering," SPBG'04 Symposium on Point-Based Graphics 2004, pp. 3-11, (2004).
Wang et al., "A Hybrid Technique Based on Combining Ray Tracing and FDTD Methods for Site-Specific Modeling of indoor Radio Wave Propagation," IEEE Transactions on Antennas and Propagation, vol. 48, No. 5, pp. 743-754 (May 2000).
Wang, et al., "Interactions of Model Detail Level and Scattering Coefficients in Room Acoustic Computer Simulation," International Symposium on Room Acoustics: Design and Science (2004).
Waterman, "T-matrix methods in acoustic scattering," The Journal of the Acoustical Society of America, vol. 125, No. 1, pp. 42-51 (Jan. 2009).
Wefers et al., "Efficient Time-Varying FIR Filtering using Crossfading Implemented in the DFT Domain," Forum Acousticum, Krakow, Poland, European Acoustics Association (2014).
Wenzel et al., "A Software-Based System for Interactive Spatial Sound Synthesis," ICAD, 6th International Conference on Auditory Display, pp. 151-156 (2000).
Wonka et al., "Guided Visibility Sampling," SIGGRAPH '06: ACM SIGGRAPH 2006 Papers, pp. 494-502 (2006).
Wonka et al., "Visibility Preprocessing with Occluder Fusion for Urban Walkthroughs," pp. 1-12 (2000).
Yee, "Numerical Solution of Initial Boundary Value Problems Involving Maxwell's Equations in isotropic Media," IEEE Transactions on Antennas and Propagation, vol. 14, No. 3, pp. 302-307 (May 1966).
Yeh, et al., "Wave-ray coupling for interactive sound propagation in large complex scenes," ACM Transactions on Graphics, vol. 32, Issue 6, pp. 165:1-165:11, (2013).
Yin et al., "Generating 3D Bulling Models from Architectural Drawings: A Survey," IEEE Computer Society, pp. 20-30 (Jan./Feb. 2009).
Yoon et al., Real-Time Massive Model Rendering, Morgan and Claypool Publishers (2008).
Zienkiewicz et al., "The Finite Element Method for Fluid Dynamics," 6 ed. Butterworth-Heinemann (Jan. 2006).
Restriction Requirement for U.S. Appl. No. 14/754,155 (Jan. 13, 2017).
Notice of Allowance and Fee(s) Due for U.S. Appl. No. 14/318,916 (Sep. 13, 2016).
Pierce, "Acoustics: An Introduction to Its Physical Principles and Applications," Acoustical Society of America (1989).
Pietrzko et al, "Mathematical Modelling of Aircraft Noise Based on Identified Directivity Patterns," Porc. 2nd AIAA/CEAS Areoacoustics Conference, pp. 1-13 (1996).
PTB http://www.ptb.de/cms/en/fachabteilungen/abt1/fb-16/ag-1630/room-acoustics/directivities.html, last viewed Jul. 23, 2012, pp. 1-3 (1978).
Non-Final Office Action for U.S. Appl. No. 14/318,916 (May 9, 2016).
Albert et al., "The Effect of Buildings on Acoustic Pulse Propagation in an Urban Enviroment," Journal of the Acoustical Society of America, vol. 127 (2010).
Botteldooren, D. 1994. Acoustical finite-difference time-domain simulation in a quasi-Cartesian grid. The Journal of the Acoustical Society of America 95, 2313.
Calamia et al., "Diffraction culling for virtual-acoustic simulations," The Journal of the Acoustical Society of America, pp. 2586-2586 (2009).
Dross, et al., "A fast reverberation estimator for virtual environments," Audio Engineering Society 30th International Conference, pp. 99-108 (Mar. 2007).
Economou, et al., "The significance of sound diffraction effects in predicting acoustics in ancient theatres," Acta Acustica united with Acustica, vol. 99, Issue 1, pp. 48-57, (2013).
Granier et al., "Experimental auralization of car audio installations," Journal of the Audio Engineering Society, vol. 44, No. 10, pp. 835-849 (Oct. 1996).
Herder, Jens, "Optimization of Sound Spatialization Resource Management Through Clustering," The Journal of Three Dimensional Images, 3D-Forum Society, vol. 13, pp. 59-65 (1999).
Jers, "Directivity of singers," The Journal of the Acoustical Society of America, vol. 118, No. 3, pp. 2008-2008 (2005).
Kropp et al, "Application of the Time Domain Firmulation of the Method of Equivalent Sources to Radiation and Scattering Problems," Acta Acustica united with Acustica, vol. 81, No. 6, pp. 528-543 (1995).
Liu, "The PTSD Algorithm: A Time-Domain Method Combining the Pseudospectral Technique and Perfectly Matched Layers," The Journal of the Acoustical Society of America, vol. 101, No. 5, p. 3182 (1997).
Ochmann, "The Full-Fled Equations for Acoustic Radiation and Scattering," The Journal of the Acoustical Society of America, vol. 105, No. 5, pp. 2574-2584 (1999).
Ochmann, "The Source Simulation Technique for Acoustic Radiation Problems," Acustica, vol. 81, pp. 512-527 (1995).
Pavic, "A Technique for the Computation of Sound Radiation by Vibrating Bodies Using Substitute Sources," Acta Acustica united with Acustica, vol. 92, pp. 112-126 (2006).
Pulkki, Ville, "Virtual Sound Source Positioning using Vector Base Amplitude Panning," Journal of the Audio Engineering Society, vol. 45, Issue 6, pp. 456-466 (1997).
Sakamoto et al, "Numerical Analysis of Sound Propagation in Rooms Using the Finite Difference Time Domain Method," The Journal of the Acousitcal Society of America, vol. 120, No. 5, p. 3008 (2006).
Southern et al, "Low Complexity Directional Sound Sources for Finite Difference Time Domain Room Acoustic Models," Audio Engineering Society Convention, vol. 126 (2009).
Southern, et al., "Spatial room impulse responses with a hybrid modeling method," Audio Engineering Society Convention 130 (2011).
Notification of Transmittal of the International Search Report and the Written Opinion of the International Searching Authority, or the Declaration for International Application No. PCT/US2013/031619 (Dec. 24, 2013).
Achanta et al., "SLIC Superpixels Compared to State-of-the-art Superpixel Methods," Journal of Latex Class Files, vol. 6, No. 1, pp. 1-8 (Dec. 2011).
Bao et al., "Understanding the 3d layout of a cluttered room from multiple images," in Applications of Computer Vision (WACV), 2014 IEEE Winter Conference on. IEEE, pp. 1-8 (2014).
Batlle et al., "Recent progress in coded structured light as a technique to solve the correspondence problem: a survey," Pattern recognition, vol. 31, No. 7, pp. 963-982, (1998).
Bell et al., "Material Recognition in the Wild with the Materials in Context Database," Computer Vision and Pattern Recognition (CVPR), pp. 3479-3487 (2015).

(56) References Cited

OTHER PUBLICATIONS

Branch et al., "Automatic hole-filling of triangular meshes using local radial basis function," in 3D Data Processing, Visualization, and Transmission, Third International Symposium on. IEEE, pp. 1-8 (2006).
Chen et al., "3D indoor scene modeling from rgb-d data: a survey," Computational Visual Media, vol. 1, No. 4, pp. 267-278, (2015).
Christensen et al., "Estimating absorption of materials to match room model against existing room using a genetic algorithm," in Forum Acusticum 2014, At Krakow, Poland, pp. 1-10 (2014).
Cimpoi et al., "Deep convolutional filter banks for texture recognition and segmentation," arXiv preprint arXiv:1411.6836, pp. 1-10 (2014).
Commonly-assigned, co-pending U.S. Appl. No. 15/435,243 for "Methods, Systems, and Computer Readable Media for Acoustic Classification and Optimization for Multi-Modal Rendering of Real-World Scenes," (Unpublished, filed Feb. 16, 2017).
Dou et al., "Exploring high-level plane primitives for indoor 3D reconstruction with a hand-held RGB-D camera," in Computer Vision-ACCV 2012 Workshops. Springer, pp. 94-108 (2013).
Foster, "Impulse response measurement using golay codes," in Acoustics, Speech, and Signal Processing, IEEE International Conference on ICASSP'86., vol. 11. IEEE, pp. 929-932 (1986).
Härmä et al. "Augmented Reality Audio for Mobile and Wearable Appliances," Journal of the Audio Engineering Society, vol. 52, No. 6, pp. 618-639 (2004).
Hu et al., "Toward Robust Material Recognition for Everyday Objects." in BMVC, vol. 13, pp. 1-11 (2011).
ISO, "ISO 354, Acoustics—Measurement of sound absorption in a reverberation room." International Standards Organisation, 2nd Edition, No. 354, pp. 1-21 (2003).
Jia et al., "Caffe: Convolutional Architecture for Fast Feature Embedding," in Proceedings of the 22nd ACM International Conference on Multimedia, pp. 1-4 (2014).
Larsson et al., "Auditory-induced presence in mixed reality environments and related technology," in The Engineering of Mixed Reality Systems. Springer, pp. 1-23 (2010).
Liu et al., "Exploring features in a bayesian framework for material recognition," in Computer Vision and Pattern Recognition (CVPR), 2010 IEEE Conference, pp. 1-8 (2010).
Liu et al., "Rent3D: Floor-plan priors for monocular layout estimation," in Proceedings of the IEEE Conference on Computer Vision and Pattern Recognition, pp. 3413-3421 (2015).
Monks et al., "Audioptimization: Goal-Based Acoustic Design," Laboratory for Computer Science, Massachusetts Institute of Technology, 32 pages, (Sep. 1998).
Mückl et al., "Precomputing sound scattering for structured surfaces," in Proceedings of the 14th Eurographics Symposium on Parallel Graphics and Visualization, pp. 1-8 (2014).
Nava, "Inverse sound rendering: In-situ estimation of surface acoustic impedance for acoustic simulation and design of real indoor environments," Ph.D. dissertation, Graduate School of Information Science and Technology, University of Tokyo, pp. 1-111 (2007).
Newcombe et al., "KinectFusion: Real-time dense surface mapping and tracking," in Mixed and augmented reality (ISMAR), 2011 10th IEEE international snposium on. IEEE, pp. 1-10 (2011).
Pulkki, Spatial sound generation and perception by amplitude panning techniques. Helsinki University of Technology, Report 62, pp. 1-59 (2001).
Rindel et al., "Odeon, a design tool for noise control in indoor environments," in Proceedings of the International Conference Noise at work. Lille, pp. 1-9 (2007).
Saksela et al., "Optimization of absorption placement using geometrical acoustic models and least squares," The Journal of the Acoustical Society of America, vol. 137, No. 4, pp. EL274-EL280 (2015).
Scharstein et al., "High-accuracy stereo depth maps using structured light," in IEEE Computer Vision and Pattern Recognition., vol. 1. IEEE, pp. 195-202 (2003).
Seddeq, "Factors influencing acoustic performance of sound absorptive materials," Australian Journal of Basic and Applied Sciences, vol. 3, No. 4, pp. 4610-4617 (2009).
Sormann et al., "Watertight multi-view reconstruction based on volumetric graph-cuts," in Image analysis. Springer, pp. 393-402 (2007).
Szegedy et al., "Going Deeper with Convolutions," in The IEEE Conference on Computer Vision and Pattern Recognition (CVPR), pp. 1-9 (Jun. 2015).
Wang et al., "A Hole-Filling Strategy for Reconstruction of Smooth Surfaces in Range Images," in XVI Brazilian Symposium on Computer Graphics and Image Processing, SIBGRAPI 2003, IEEE, pp. 1-9 (2003).

* cited by examiner

METHODS, SYSTEMS, AND COMPUTER READABLE MEDIA FOR SIMULATING SOUND PROPAGATION IN LARGE SCENES USING EQUIVALENT SOURCES

RELATED APPLICATIONS

The presently disclosed subject matter claims the benefit of U.S. Provisional Patent Application Ser. No. 61/614,468, filed Mar. 22, 2012; the disclosure of which is incorporated herein by reference in its entirety.

GOVERNMENT INTEREST

This invention was made with government support under Grant No. W911NF-10-1-0506 awarded by the Army Research Office and Grant Nos. CMMI-1000579, IIS-0917040, and 0904990 awarded by the National Science Foundation. The government has certain rights in this invention.

TECHNICAL FIELD

The subject matter described herein relates to simulating sound propagation in a scene. More particularly, the subject matter described herein includes methods, systems, and computer readable media for simulating sound propagation in large scenes using equivalent sources.

BACKGROUND

Interactive sound propagation has emerged as a powerful tool in computer graphics to enhance the realism of virtual worlds by predicting the behavior of sound as it interacts with the environment. In order to generate realistic acoustic effects, including interference, diffraction, scattering, and higher-order effects, it is important to develop techniques that can directly solve the acoustic wave equation. There is extensive work on numerical methods in scientific computing and acoustics to solve the wave equation. Furthermore, there has been considerable interest in developing interactive wave techniques such as modeling free-space sound radiation [James et al. 2006], first-order scattering from surfaces [Tsingos et al. 2007], and performing sound propagation for indoor scenes [Savioja 2010; Raghuvanshi et al. 2010].

Large open scenes, which arise in many applications ranging from games to training/simulation systems, present a significant challenge for interactive wave-based sound propagation techniques. State-of-the-art wave simulation methods can take hours of computation and gigabytes of memory for performing sound propagation in indoor scenes such as concert halls. For large, open scenes spanning hundreds of meters, it is challenging to run these techniques in real-time. On the other hand, geometric (ray-based) acoustic techniques can provide real-time performance for such environments. However, geometric techniques are better suited for higher frequencies of the audible range since accurately modeling diffraction and higher-order wave effects remains a significant challenge, especially at low frequencies.

SUMMARY

The subject matter described herein includes methods, systems, and computer readable media for simulating sound propagation in large scenes using equivalent sources. One method for simulating sound propagation in a scene includes decomposing a scene into disjoint objects. Per object transfer functions are generated for each of the disjoint objects. Each per object transfer function maps an incoming sound field reaching an object to an outgoing sound field emanating from the object. A plurality of inter-object transfer functions corresponding to pairs of the disjoint objects is generated. Each inter-object transfer function maps the outgoing sound field emanating from one of the disjoint objects to an incoming sound field of another of the disjoint objects. The per-object transfer functions and the inter-object transfer functions are used to perform simulation of sound propagation within the scene and thereby to determine a sound field for the scene.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings of which:

In FIG. 1, image (a) is an image of a reservoir from the video game Half-Life 2, image (b) is an outdoor scene in winter, and image (c) is an outdoor scene of a desert.

In FIG. 2, image (a) is a diagram illustrating a radiating object A, its corresponding boundary (offset surface) $\partial A$, exterior region $\partial A^+$, interior region $\partial A^-$ and the set of equivalent sources (denoted by stars), image (b) is a classification of objects in a scene. The triangle and rectangle constitute a single object, as their offset surfaces overlap. On the other hand, L-shaped objects labeled Object 2 and Object 3 are classified as separate objects.

FIG. 8 is a block diagram of an exemplary system for simulating sound propagation within a scene using equivalent sources according to an embodiment of the subject matter described herein.

FIG. 9 is a flow chart of an exemplary process for simulating sound propagation within a scene according to an embodiment of the subject matter described herein.

DETAILED DESCRIPTION

Figure 1A:
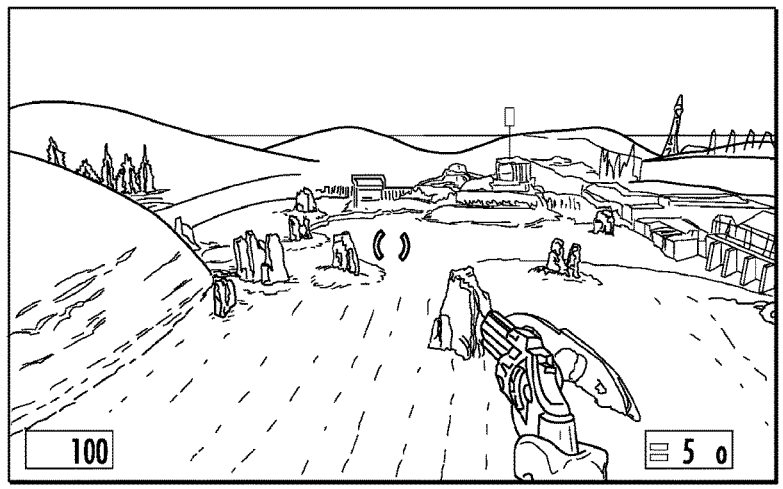
FIG. 1 illustrates images of exemplary scenes in which the subject matter described herein may be utilized.

The subject matter described herein includes an approach for precomputed wave-based sound propagation that is applicable to large, open scenes. It is based on the equivalent source method, which has been widely studied for radiation and scattering problems in acoustics and electromagnetics [Doicu et al. 2000]. Our approach consists of two main stages—preprocessing and runtime. During preprocessing, we decompose the scene into disjoint, well-separated rigid objects. The acoustic behavior of each object taken independently is characterized by its per-object transfer function, which maps an arbitrary incident field on the object to the resulting scattered field. We propose an equivalent source formulation to express this transfer function as a compact scattering matrix. Pairwise acoustic coupling between objects is then modeled by computing inter-object transfer functions between all pairs of objects, which maps outgoing scattered field from one object to incoming field on another object. These transfer functions are represented compactly by using the same equivalent source framework, yielding interaction matrices. Acoustic transfer between multiple objects can thus be represented using chained multiplication of their scattering and interaction matrices. Finally, the acoustic response of the scene to a static source distribution is computed by solving a global linear system that accounts for all orders of inter-object wave propagation.

At run-time, fast summation over all outgoing equivalent sources for all objects is performed at the listener location(s). The computed response is used for real-time binaural sound rendering. Multiple moving sources with a static listener can be handled by exploiting acoustic reciprocity. The runtime memory and computational requirements are proportional to the number of objects and their outgoing field complexity (usually a few thousand equivalent sources for a few percent error), instead of the volume or surface area of the scene. Exemplary contributions of our work include:

Object-based sound field decomposition using per- and inter-object acoustic transfer functions for enabling interactive wave-based sound propagation on large, open scenes.

Compact per-object transfer using equivalent sources to model the scattering behavior of an object mapping arbitrary incident fields to the resultant scattered fields.

Compact analytical coupling of objects is achieved by expressing inter-object transfer functions in the same, compact equivalent source basis used per object.

Fast, memory-efficient run-time of our technique enables real-time sound rendering for a moving source or listener, with only a few tens of megabytes of memory footprint.

Our approach is well-suited for quick iterations while authoring scenes—per-object transfer functions, which take a significant portion of our precomputation time, are independent of the scene and can thus be stored in a lookup table. Thus, adding, deleting or moving a few objects in an existing scene has low precomputation overhead, linear in the number of objects.

Figure 1B:
Figure 1C:
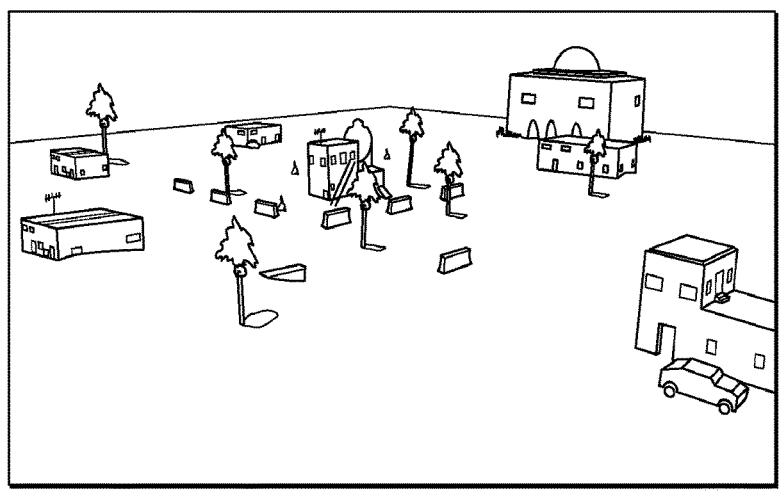

We have tested our technique on a variety of benchmarks (FIG. 1) and integrated our system with the Valve Source game engine (Half-Life 2). Our technique takes orders of magnitude less runtime memory compared to state-of-the-art wave solvers, thus enabling interactive performance and generates realistic acoustic effects. To the best of our knowledge, ours is the first real-time technique for accurate wave-based sound propagation in such large open scenes.

Related Work

Our technique has close theoretical parallels with prior numerical wave solvers. We first explore these connections, followed by a comparison with related prior work in interactive geometric and wave-based techniques.

2.1 Numerical Wave Solvers

Research in wave-based acoustic simulation techniques spans a broad range of areas such as noise control, automotive design, urban architectural planning and concert hall design. Wave solvers can be classified into volumetric and surface-based approaches. The most common among volumetric techniques are the Finite Element Method (FEM) [Zienldewicz et al. 2006; Thompson 2006] and Finite Difference Time Domain (FDTD) method [Yee 1966; Taflove and Hagness 2005; Sakamoto et al. 2006], which require a discretization of the entire volume of the scene. The compute and memory usage of these methods thus increases linearly with the volume of the scene. Faster methods like Pseudospectral Time Domain (PSTD) [Liu 1997] and Adaptive Rectangular Decomposition (ARD) [Raghuvanshi et al. 2009] have been proposed and achieve good accuracy with a much coarser spatial discretization. Volumetric techniques are well-suited for scenes with high surface area and low air volume, which makes them highly applicable to indoor spaces.

Surface-based techniques are better suited for open scenes, for which scattering geometry is sparse with large regions of air with uniform wave-propagation speed. The most common approach here is the Boundary Element Method (BEM) [Cheng and Cheng 2005], which express the global acoustic field as the sum of the elementary radiating fields from monopole and dipole sources placed on a uniform, sub-wavelength sampling of the scene's surface. Traditional BEM scales as the square of the surface area but recent research on the Fast Multipole Method for BEM (FMM-BEM) [Liu et al. 2009; Gumerov and Duraiswami 2009] has improved the complexity to linear in surface area by creating a hierarchical clustering of BEM monopoles and dipoles (using an Octree) and approximating their interactions compactly using high-order multipole Green's functions.

For acoustic radiation and scattering problems, an efficient and powerful surface-based technique is the Equivalent Source Method (ESM) [Fairweather 2003; Kropp and Svensson 1995; Ochmann 1999; Pavic 2006], which forms the basis of our formulation. Instead of relying on a boundary-integral formulation as BEM does, ESM exploits the uniqueness of solutions to the acoustic boundary value problem—equivalent multipole sources (Green's functions) are placed at variable locations in space with the intent of making the total generated field match boundary conditions on the object's surface, since uniqueness guarantees correctness of the solution. The flexibility of location results in fewer multipole sources. The ESM can result in large gains in performance and memory-efficiency for scattering and radiation problems in large spaces, and has hence been used widely in both acoustic and electromagnetic applications [Doicu et al. 2000]. ESM is an attractive starting point for precomputed approaches such as [James et al. 2006] and our method, because it allows very flexible performance-accuracy tradeoffs. More importantly, the compactness of the solutions reduces runtime memory and compute requirements by a large factor making them amenable for real-time evaluation. Offline FMM-BEM solutions are infeasible for interactive applications because of the large, dense number of monopole and dipole sources in the final solution that needs to be stored and summed on the fly.

A related technique called the Transition-matrix method has been used extensively for electromagnetic scattering, and also developed for acoustics [Waterman 2009]. The method relates the incoming and outgoing fields in a scattering process in terms of the coefficients of a complete system of the vector basis functions, that are not necessarily Green's functions, unlike BEM or ESM.

2.2 Interactive Geometric Techniques

Most current interactive sound propagation systems are based on geometric acoustics, which applies the high-frequency Eikonal (ray) approximation to sound propagation. The image source method [Allen and Berkley 1979] is the most commonly used geometric technique, and there has been much research on improving its performance [Funkhouser et al. 1998]. However, the image source method can only model purely specular reflections. Other techniques based on ray tracing [Vorlander 1989; Lentz et al. 2007] or radiosity [Tsingos and Gascuel 1997] have been developed for modeling diffuse reflections, but these energy-based formulations may not model phase accurately. Techniques based on acoustic radiance transfer [Siltanen et al. 2007] can model arbitrary surface interactions for wide-band signals, but cannot accurately model wave phenomena such as diffraction. The two main approaches for modeling diffraction in a geometric acoustics framework are the Uniform Theory of Diffraction (UTD) [Tsingos et al. 2001] and the Biot-Tolstoy-Medwin (BTM) formulation [Svensson et al. 1999]. UTD is an approximate formulation while the BTM yields accurate results at a significant performance cost. Methods based on image source gradients [Tsingos 2009] and acoustic radiance transfer operators [Antani et al. 2012] have been developed to interactively model higher-order propagation effects. Recent developments in fast ray tracing have enabled interactive geometric propagation in dynamic scenes, but these methods only model first order edge diffraction based on UTD [Taylor et al. 2009].

2.3 Interactive Wave-Simulation Techniques

Sound propagation from a single radiating object in free space can be efficiently modeled using Precomputed Acoustic Transfer (PAT) [James et al. 2006], based on equivalent sources. [Tsingos et al. 2007] solves the boundary integral formulation of the Helmholtz equation subject to the Kirchhoff approximation in real-time. [Raghuvanshi et al. 2010] relies on a volumetric sampling of acoustic responses on a spatial grid and perceptual encoding based on acoustic properties of indoor spaces. Recent work has shown that FDTD simulations can be run in real-time on the GPU [Savioja 2010], but only for very small spaces that span a few meters across. We compare our method in more detail with other interactive wave-simulation techniques in Section 6.3.

3 The Equivalent Source Method

TABLE 1

Table of commonly used symbols

| Symbols | Meaning |
| --- | --- |
| p | (complex-valued) pressure field |
| $q_i$ | $i^{th}$ eq. src |
| $\phi_{ik}$ | $k^{th}$ multipole term of $q_i$ |
| $q_i^{in}, q_j^{out}$ | $i^{th}$ & $j^{th}$ eq. src for incoming, outgoing field resp. |
| $\phi_{ik}^{in}, \phi_{jh}^{out}$ | $k^{th}$ & $h^{th}$ multipole term of eq. src. $q_i^{in}$ & $q_j^{out}$ resp. |
| P, Q | number of outgoing, incoming eq. srcs resp. |
| N, M | order of outgoing, incoming multipoles resp. |
| σ, η | error threshold for per-object, inter-object transfer function |
| m | number of objects |
| n | number of samples on object's offset surface |

Figure 2A:
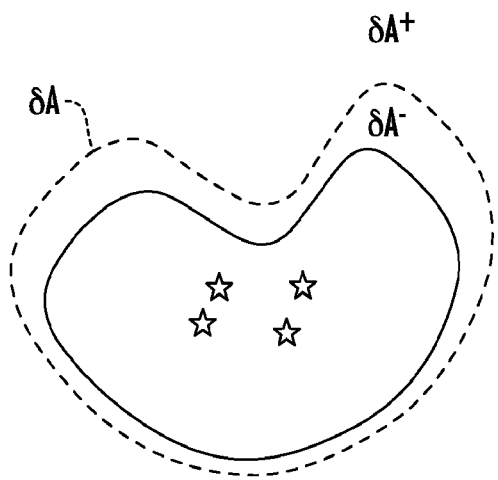
FIG. 2 illustrates diagrams of objects within a scene.

In this section, we give a brief review of the Equivalent Source Method, starting with our notation in Table 1. Consider the exterior scattering problem [Thompson and Pinsky 2004]—a solid three-dimensional object A immersed in an unbounded air volume (FIG. 2(a)). Considering only time-harmonic vibrations with angular frequency ω and a homogeneous medium with constant speed of sound c, acoustic wave propagation can be expressed as a boundary value problem for the Helmholtz equation:

$$\nabla^2 p + \frac{\omega^2}{c^2} p = 0 \text{ in } \partial A^+, \quad (1)$$

where p is the (complex-valued) pressure field, $\partial A^+$ is the domain exterior to the object and $\nabla^2$ is the Laplacian operator. At the boundary of the domain, $\partial A$ the pressure is specified using a Dirichlet boundary condition:

$$p = f(x) \text{ on } \partial A, \quad (2)$$

To complete the problem specification, the behavior of p at infinity must be specified, usually by the Somtnetfeld radiation condition [Pierce 1989]. The Equivalent Source Method [Ochmann 1995; Ochmann 1999; Pavic 2006] relies on the existence of fundamental solutions (also called Green's functions or equivalent sources), q(x, y), of the Helmholtz equation (1) subject to the Sommerfeld radiation condition for all x≠y. An equivalent source, q(x, $y_i$), is the solution field induced at any point x due to a point source located at $y_i$, and can be expressed as the sum:

$$q(x, y_i) = \sum_{l=0}^{L-1} \sum_{m=-l}^{l} d_{ilm}\varphi_{ilm}(x) = \sum_{k=1}^{L^2} d_{ik}\varphi_{ik}(x), \quad (3)$$

where k is a generalized index for (l, m). The fundamental solution $\phi_{ik}(x)$ is a multipole source located at $y_i$, $d_{ik}$ is its strength and L is the order of the multipole (L=1 is just a monopole, L=2 includes dipole terms as well, and so on). (Refer to the Appendix A.1 for the full expression of $\phi_{ilm}(x)$.)

The fundamental solutions $\phi_{ik}(x)$ are used to solve the Helmholtz equation. Consider the outgoing scattered field due to an object, and the associated Dirichlet boundary value problem on a smooth offset boundary $\partial A$. Consider a discrete set of R source locations $\{y_i\}_{i=1}^{R}$, all contained in the interior region $\partial A^-$. The total field due to these sources at any $x \in \partial A^+$ is:

$$p(x) = \sum_{i=1}^{R} c_i q(x, y_i) = \sum_{i=1}^{R} \sum_{k=1}^{L^2} c_{ik} \varphi_{ik}(x), \quad (4)$$

where $c_{ik} = c_i dc_{ik}$ are the corresponding strengths of the equivalent sources. The main idea of the ESM is that if the equivalent source strengths $c_{ik}$ and positions $y_i$ are chosen to match the Dirichlet boundary condition on $\partial A$, $$p(x) = \sum_{i=1}^{R} \sum_{k=1}^{L^2} c_{ik} \varphi_{ik}(x) = f(x); x \in \partial A \quad (5)$$

then p(x) is the correct solution over all $\partial A^+$. This process can also be used to represent the field incident on an object, the only difference being that the equivalent sources are now placed in the exterior region $\partial A^+$. Again, by matching the boundary condition (5), we get the correct solution p(x) for all x in the interior region $\partial A^-$.

In practice, the boundary conditions can only be satisfied approximately with a finite number of sources (R), and the degree of approximation can be controlled by changing R. Since each source's multipole strengths must be stored and its contribution evaluated at run-time, R is the main parameter for trading accuracy for run time performance and memory requirements. This flexibility makes the ESM highly suitable for interactive applications.

4 Sound Propagation Using ESM

Figure 3:
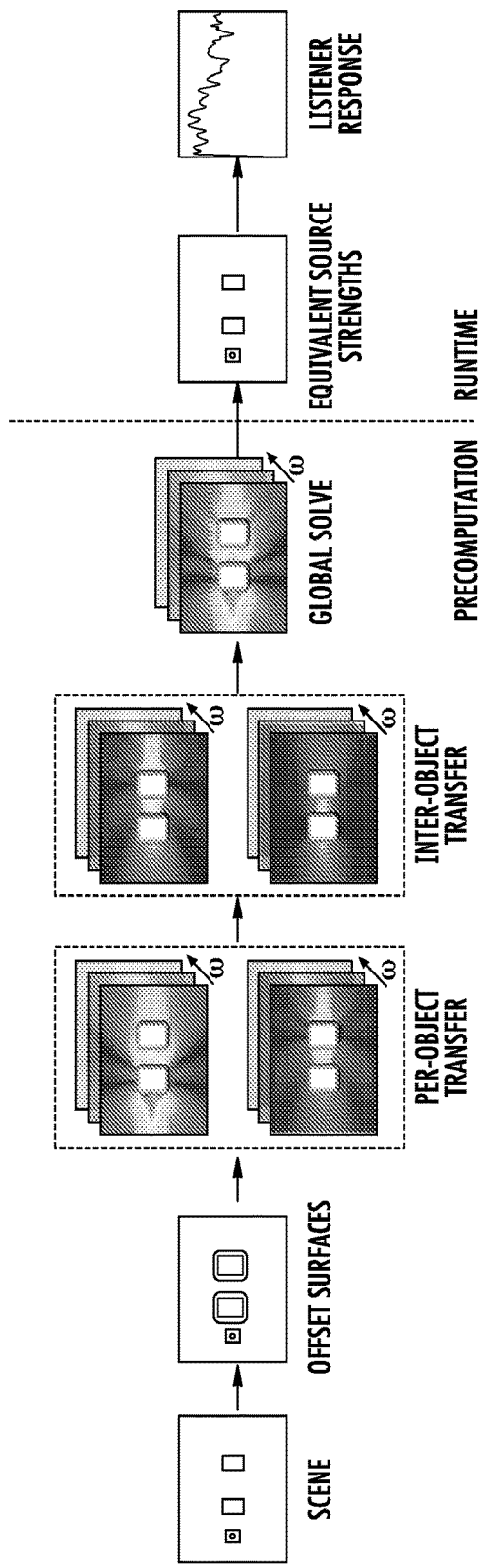
FIG. 3 illustrates an overview of the present wave-based sound propagation technique based on equivalent sources on a simple scene composed of two objects (shown in white). Pressure fields are visualized using different shading to denote different pressures. The darker region around each object denotes the region of highest pressure. Per-object transfer functions are computed independently for each of the two objects.

We now give a brief overview of the pre-computation and runtime stages of our technique (FIG. 3). We assume that the scene is composed of static objects. Our formulation is in the frequency domain, hence the steps outlined in this section (except the offset surface calculation) need to be performed for a regularly sampled set of frequencies in the range [0, $v_{max}$] where 0, $v_{max}$ is the maximum frequency simulated.

4.1 Our Approach

Offset surface calculation: In the pre-processing stage, we first classify objects in the scene and calculate the offset surface for each object. Per-object transfer function: For each object, we compute a per-object transfer function, which maps the incoming field reaching the object to the outgoing scattered field.

Inter-object transfer function: For each object pair, we pre-compute an inter-object transfer function, which encodes how the outgoing scattered field of one object becomes the incoming field for another object.

Global solve: Based on per-object and inter-object transfer functions, and a sound source configuration, we model acoustic interactions between the objects in the scene, thereby computing the strengths of all the outgoing field equivalent sources of all objects.

Run-time pressure evaluation: At run-time, we add the pressure produced by all the outgoing field equivalent sources at the listener position for each frequency. This is an extremely fast computation, and can be performed for moving sources or a moving listener in real-time.

4.2 Offset Surface Calculation

Figure 2B:
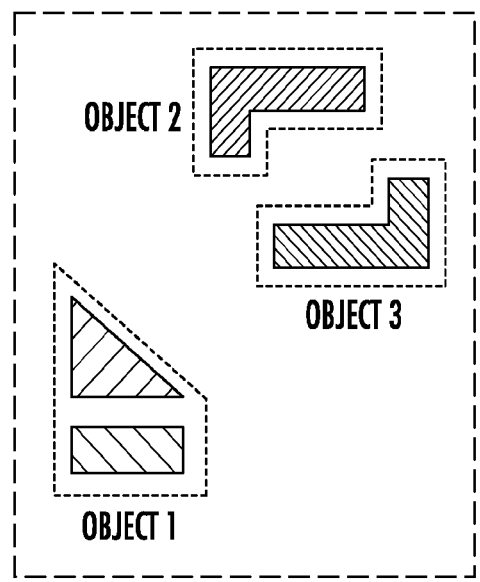

The first step is to decompose the input scene into well-separated objects. To decide if two objects are well-separated, we use the notion of an offset surface. The offset surface is defined by taking the constant offset along the normal direction at each point on the boundary of the object. Two objects are considered disjoint if and only if their offset surfaces do not intersect. Otherwise, we combine them and treat them as a single object (see FIG. 2(b)). We compute the offset surface of an object using distance field and the marching cubes algorithm. Typical values of distance field voxel resolution h and offset distance δ are specified in Table 3. After decomposing the scene into well-separated objects, we compute the scattering properties for each object independently.

4.3 Per-Object Transfer Function

In order to capture an object's scattering behavior, we define a per-object transfer function $f$, a function which maps an arbitrary incoming field reaching the object to the corresponding outgoing scattered field after reflection, scattering and diffraction due to the object itself. This function is linear owing to the linearity of the wave equation and depends only on the shape and material properties of the object.

The incoming and outgoing fields for an object A are both expressed using equivalent sources. The outgoing field is represented by placing equivalent sources $\{q_1^{out}, q_2^{out}, q_3^{out}, \ldots\}$ in the interior region $\partial A^-$ of the object. Similarly, the incoming field is represented by placing equivalent sources $\{q_1^{in}, q_2^{in}, q_3^{in}, \ldots\}$ in the exterior region $\partial A^+$. The transfer function $f$ maps the basis of the incoming field (multipoles $\phi_{ik}^{in}$) to the corresponding outgoing field expressed as a linear combination of its basis functions (multipoles $\phi_{jh}^{out}$):

$$\begin{bmatrix} f(\varphi_{11}^{in}) \\ f(\varphi_{12}^{in}) \\ \vdots \\ \vdots \\ f(\varphi_{QM^2}^{in}) \end{bmatrix} = \begin{bmatrix} \alpha_{11}^{11} & \alpha_{12}^{11} & \ldots & \alpha_{PN^2}^{11} \\ \alpha_{11}^{12} & \alpha_{12}^{12} & \ldots & \alpha_{PN^2}^{12} \\ \vdots & \vdots & \ldots & \vdots \\ \vdots & \vdots & \ldots & \vdots \\ \alpha_{11}^{QM^2} & \alpha_{12}^{QM^2} & \ldots & \alpha_{PN^2}^{QM^2} \end{bmatrix} \begin{bmatrix} \varphi_{11}^{out} \\ \varphi_{12}^{out} \\ \vdots \\ \vdots \\ \varphi_{PN^2}^{out} \end{bmatrix} \quad (6)$$

$$= T_A \Phi_A^{out}$$

where $\alpha_{jh}^{ik} \equiv T_A(ik, jh)$ is the (complex) amplitude for the outgoing multipole $\phi_{jh}^{out}$ induced by a unit amplitude incoming multipole $\phi_{ik}^{in}$. The per-object sound transfer function for object A is encoded in the coefficient matrix $T_A$, which we call the scattering matrix.

Computing the Scattering Matrix

For each incoming field multipole in turn, we place a unit-amplitude sound source $\phi_{ik}$ and use a numerical wave solver to compute the total pressure field at n uniformly sampled locations $\{x_1, x_2, \ldots, x_n\}$ on $\partial A$. We subtract the incident field from the total pressure field to compute the outgoing scattered field (see FIG. 4A, panel (c)) at these sampled locations, denoted by $\overline{P}_{ik} = \{p(x_1), p(x_2), \ldots, p(x_n)\}$.

We fit the outgoing field multipole expansion to the sampled scattered field, in a least-squares sense, by solving an over-determined linear system (n>PN$^2$) subject to a pre-specified error threshold a for all incoming field multipoles:

$$\sum_{(j,h)=(1,1)}^{(P,N^2)} \varphi_{jh}^{out}(x_t)\alpha_{jh}^{ik} = p(x_t), \quad (7)$$

for $t = 1 \ldots n$ $$V\alpha^{ik} = \overline{p}_{ik} \quad (8)$$

The least-squares solution yields the coefficients $\alpha^{ik}$ corresponding to the ik$^{th}$ row of the scattering matrix T. This process is repeated for all incoming source multipoles to compute the scattering matrix. The solution can be computed efficiently using a single combined linear system:

$$VT_A^{tr} = [\overline{p}_{11} \ldots \overline{p}_{QM^2}] \quad (9)$$

where $T_A^{tr}$ is the transpose of $T_A$. The per-object transfer function is computed for all objects at sampled frequencies. Details on choosing the number and positions of both incoming and outgoing equivalent sources are given in Section 4.5.

4.4 Inter-Object Transfer Function

Scenes with multiple objects exhibit object-to-object interactions, where the outgoing field from one object enters as the incoming field in other objects. For example, with two objects A and B, source s and listener l, the possible interactions that can occur from s to l are: direct sound (0$^{th}$ order) s→l; 1$^{st}$ order s→A→l; S→B→l; 2$^{nd}$ order s→A→B→l; S→B→A→l, and so on. We model these interactions by formulating an inter-object transfer function. For two objects A and B, the inter-object transfer function $g_A^B$ expresses the outgoing field of A in terms of the basis of incoming field of B. Like the per-object transfer function, the inter-object transfer function is also a linear function. The inter-object transfer function $g_A^B$ maps each basis function of the outgoing field of A (multipoles $\phi_{jh}^{out}$) to the corresponding incoming field of B expressed as a linear combination of its basis functions (multipoles $\phi_{ik}^{in}$):

$$\begin{bmatrix} g_A^B(\varphi_{11}^{out}) \\ g_A^B(\varphi_{12}^{out}) \\ \vdots \\ \vdots \\ g_A^B(\varphi_{PN^2}^{out}) \end{bmatrix} = \begin{bmatrix} \beta_{11}^{11} & \beta_{12}^{11} & \ldots & \beta_{QM^2}^{11} \\ \beta_{11}^{12} & \beta_{12}^{12} & \ldots & \beta_{QM^2}^{12} \\ \vdots & \vdots & \ldots & \vdots \\ \vdots & \vdots & \ldots & \vdots \\ \beta_{11}^{PN^2} & \beta_{12}^{PN^2} & \ldots & \beta_{QM^2}^{PN^2} \end{bmatrix} \begin{bmatrix} \varphi_{11}^{in} \\ \varphi_{12}^{in} \\ \vdots \\ \vdots \\ \varphi_{QM^2}^{in} \end{bmatrix} \quad (10)$$

$$= G_A^B \Phi_B^{in},$$

where $\beta_{ik}^{jh} = G_A^B(jh, ik)$ is the (complex) amplitude of the incoming multipole $\phi_{ik}^{in}$ of B induced by a unit-amplitude outgoing multipole $\phi_{jh}^{out}$ of A. The inter-object transfer function from A to B is thus encoded as $G_A^B$, which we call the interaction matrix. The interaction matrix is not symmetric in general, i.e. $G_A^B \neq G_B^A$. Since the outgoing field of an object is not defined in its interior region, $G_A^A$ and $G_B^B$ are zero matrices.

Computing the Interaction Matrix

The interaction matrix $G_A^B$ can be computed using a least-squares formulation similar to the one used for computing scattering matrices. However, the pressure values at the offset surface samples for B, $\overline{P}_{jh} = \{p(x_1), p(x_2), \ldots, p(x_n)\}$ are simpler to compute. In a homogenous medium, the outgoing field due to a multipole is the same as the free space field, for which analytical expressions exist (see Appendix A.1). Therefore, we simply evaluate the analytical expressions of the outgoing field multipoles $\phi_{jh}^{out}$ of A at the sample points of B. The resulting linear system is solved subject to a separate error threshold, $\eta$:

$$\sum_{(i,k)=(1,1)}^{(Q,M^2)} \varphi_{ik}^{in}(x_t)\beta_{ik}^{jh} = p(x_t), \quad (11)$$

for $t = 1, \ldots, n$,

Again, this process is repeated for each outgoing multipole of B, and solved efficiently as a single combined linear system:

$$UG_A^{B^{tr}} = [\overline{p}_{11} \ldots \overline{p}_{PN^2}] \quad (12)$$

The inter-object transfer functions are computed for all object pairs, independently for each frequency.

4.5 Computing Equivalent Source Positions

Choosing offset surface samples Solving equations (9) and (12) at frequency $f$ involves computing the pressure at sampled locations $\{x_1, x_2, \ldots, x_n\}$ on the offset surface of each object. The number of sampled locations n depends on the spatial variation of the pressure field, which in turn, depends on its frequency $f$. As per Nyquist theorem, representing a signal at frequency $f$ with a finite number of samples requires a sampling rate of $2f$. The spatially-varying pressure field defined on the 2D offset surface S must be sampled at a rate of $2f$ in both dimensions. Therefore, we place $n \propto (2f)^2 \times$ area (S) samples uniformly on the offset surface.

Choosing incoming equivalent sources Since the nature of the incoming field is not known a priori, it is hard to optimize the number and position of incoming equivalent sources. We resolve this problem by generating another offset surface at distance $\Delta > \delta$ from the object (where $\delta$ is the original offset surface's distance) and placing incoming equivalent sources on this new surface. The number of incoming equivalent sources Q depends on the spatial variation of the incoming pressure field. As before, $Q \propto (2f)^2 \times$ area (S) equivalent sources are placed uniformly on the larger offset surface. This allows us to represent the incoming field on the inner offset surface to good accuracy.

Choosing outgoing equivalent sources The number of outgoing equivalent sources P and their positions are decided based on a multi-level source placement algorithm similar to [James et al. 2006]. The previous algorithm was designed to satisfy a single radiating field of an object at each frequency. Our algorithm is designed to satisfy multiple outgoing radiating fields at each frequency simultaneously. In our case, for each object at each frequency, we have as many outgoing radiating fields as the number of incoming multipoles QM$^2$. This gives us a vector of pressure residuals $r = [r_1 r_2 \ldots r_{QM^2}]^{tr}$ and a corresponding vector of projections $p=[p_1 p_2 \ldots p_{QM^2}]^{tr}$ where $p_i=\|(U_x)^H r_i\|_2$. We choose the best candidate as the one that minimizes the pressure residual of all the outgoing fields simultaneously via a modified largest projection $x^*=\arg\max_{x \in \chi}\|p\|_2^2$. We update the unitary matrix and for each residual $r_i$ we remove its component in the chosen subspace. We then compute the modified residual $\|d\|_2$ where $d=[d_1 d_2 \ldots d_{QM^2}]$ and $d_i=\|r_i\|_2$. We repeat this process until the relative value of modified residual falls below the error tolerance TOL. Similar to the number of incoming equivalent sources Q, the number of outgoing equivalent sources P also increase with frequency. But it strongly depends on the shape of the object and the complexity of the outgoing scattered field it generates. The candidate positions χ are chosen randomly on the surface of the object in the same manner as previous algorithm, but a minimum distance between any two equivalent sources is enforced to improve the condition number of the system, since extremely close equivalent sources adversely affect the conditioning of the system. We choose a minimum distance of half the wavelength at any given frequency.

4.6 Global Solve

Once the scattering and interaction matrices are computed, and the sound source position has been decided, we compute the outgoing equivalent source strengths of all the objects in the scene. We initially describe our algorithm for a simple two-object scene, and it naturally generalizes to any number of objects. Consider a sound source s and two objects A and B. Let the incoming field multipoles at A and B be $\Phi_A^{in}$ and $\Phi_B^{in}$, respectively. Similarly, let the multipole expansion for the outgoing field for A and B be $\Phi_A^{out}$ and $\Phi_B^{out}$ respectively. Let the scattering matrices for A and B are $T_A$ and $T_B$, respectively. Let the interaction matrices for the objects be $G_A^B$ and $G_B^A$ respectively. The sound source pressure field s(x) expressed in terms of incoming field multipoles is denoted $S_A$ and $S_B$, respectively. Based on these transfer functions, one can compute the steady state field after all orders of interaction. The steady state outgoing fields of A and B (denoted by $P_A^{out}$ and $P_B^{out}$ respectively) are:

$$P_A^{out} = \sum_{i=1}^{P} \sum_{k=1}^{N^2} c_{ik}^A \varphi_{ik} = C_A^{tr} \Phi_A^{out} \tag{13}$$

$$P_B^{out} = \sum_{i=1}^{P} \sum_{k=1}^{N^2} c_{ik}^B \varphi_{ik} = C_B^{tr} \Phi_B^{out} \tag{14}$$

In order to compute the source strengths, $C_A$ and $C_B$, we solve a linear system. Assume the outgoing field in the scene is $\ddot{C}$. This field, in addition to the source field $\ddot{S}$, when propagated through the scene (transferred via all possible objects), generates an incoming field on the object ($\ddot{G}\ddot{C}+\ddot{S}$). This incoming field is then scattered by the object to produce an outgoing field $\ddot{T}(\ddot{G}\ddot{C}+\ddot{S})$. Under steady state, this outgoing field must equal $\ddot{C}$. Mathematically, this can be written as $$\ddot{C}=\ddot{T}((\ddot{G}\ddot{C}+\ddot{S})$$

(see Appendix A.2 for the symbols and details). This yields a linear system for the outgoing source strengths for all objects:

$$(I-\ddot{T}\ddot{G})\ddot{C}=\ddot{T}\ddot{S} \tag{15}$$

This linear system is solved for a regularly-sampled set of frequencies. For a scene composed of multiple objects, we derive the same equation as above with the symbols having analogous meanings, as described in detail in Appendix A.3.

4.7 Runtime Computation

At the end of the preprocessing stage, we get the outgoing equivalent source strengths for all objects at regularly sampled set of frequencies corresponding to each sound source. During run-time, we use these strengths to compute the pressure field at any listener position x:

$$p(x) = \sum_{j=1}^{m} C_{A_j}^{tr} \Phi_{A_j}^{out}(x) + s(x), \tag{16}$$

where m is the number of objects in the scene, s(x) is the field generated by the sound source, and $C_{A_j}=\{c_{11}^{A_j}, c_{12}^{A_j} \ldots c_{PN^2}^{A_j}\}^{tr}$. This computation is performed at regularly-sampled set of frequencies and repeated for each source to compute a band-limited frequency response. Evaluating the above expression for a new value of x is very efficient, allowing a moving listener to be handled naturally in real-time. Note that the pressure can be evaluated at any position x in space and not necessarily at grid positions. Therefore, no spatial interpolation is required with our technique since the analytical expressions for equivalent source solutions are used. Unlike grid-based approaches like FDTD, our equivalent source method is independent of the spatial discretization, resulting in a much smoother auralization for a moving listener. The case of multiple moving sources with a fixed listener is handled using the principle of acoustic reciprocity, by switching the role of source and listener.

5 Implementation

In this section, we describe the implementation details of our technique. Typical parameter values used in our experiments are specified in Table 3.

TABLE 3

| Parameters used in our system | | |
|---|---|---|
| Parameter | Value | Description |
| c | 340 m/s | speed of sound |
| $v_{max}$ | 1 kHz | highest frequency simulated |
| h | $c/2v_{max}$ = 0.17 m | distance field's voxel resolution |
| δ | 5 h = 0.85 m | inner offset distance |
| Δ | 8 h = 1.36 m | outer offset distance |
| σ | 15% | error threshold for scattering matrix |
| η | 1% | error threshold for transfer matrix |

Implementation Details The offset surface generation code is written in C++. When computing per-object transfer functions, outgoing scattered fields are computed on the offset surface (Section 4.3) using an efficient GPU-based implementation of the ARD wave solver [Raghuvanshi et al. 2009]. The remaining parts of the pre-processing stage (solving the linear system for per-object transfer functions, inter-object transfer functions and equivalent source strengths) are implemented in MATLAB. Precomputation for each frequency is performed in parallel over the nodes of a CPU cluster.

The run-time code is written in C++, and has also been integrated with Valve's Source engine, as demonstrated in the supplementary video.

The timing results for offset surface generation, the ARD solver, and run-time code are measured on a 4-core 2.80 GHz Xeon X5560 desktop with 4 GB of RAM and NVIDIA GeForce GTX 480 GPU 429 with 1.5 GB memory. The timing results for the MATLAB-based precomputation are measured on a 64-node CPU cluster (8-core, 2.80 GHz, 48 GB, Xeon X5560 processor nodes). Detailed statistics are provided in Table 2.

TABLE 2

Performance statistics

| Scene | #objs. | #freq | #srcs | Wave sim (total) | per-object (per freq) | inter-object (per fret) | source-field (per-freq, per-arc) | global-solve (per freq, per src) | # eq. srcs (total, per arc) | eval. (total, per arc) | storage (total, fixed + per arc) |
|---|---|---|---|---|---|---|---|---|---|---|---|
| Concave | 1 | 250 | 1 | 80 min | 51 min | NA | 1 min | 0.1 min | 0.1M | 3 ms | (1 + 4) NlB |
| Wall | 1 | 250 | 1 | 50 min | 101 min | NA | 3 min | 0.1 min | 0.1M | 4 ms | (2 + 5) MB |
| Rock | 1 | 250 | 1 | 80 min | 87 min | NA | 1 min | 0.1 min | 0.4M | 10 ms | (4 + 11) MB |
| Parallel | 2* | 250 | 1 | 50 min | 101 min | 13 min | 6 min | 1.4 min | 0.2M | 8 ms | (4 + 10) MB |
| Desert | 4* + 2* | 500 | 3 | 360 min | 196 min | 98 min | 9 min | 26 min | 1.1M | 26 ms | (12 + 33) MB |
| Reservoir | 4* + 1 | 500 | 2 | 293 min | 224 min | 63 min | 7 min | 15 min | 1.3M | 33 ms | (15 + 41) MB |
| Christmas | 2* + 2* + 1 | 500 | 2 | 890 min | 301 min | 71 min | 7 min | 18 min | 1.5M | 38 ms | (18 + 47) MB |

Abbreviations used in Table 2 are as follows: "#objs." denotes the number of objects in the scene, "#freq." is the number of frequency sampled in the range [0-$v_{max}$], "#srcs" is the number of sound sources, "wave sim." is the total simulation time of the numerical wave solver for all objects for all frequencies, "per-object" and "inter-object" denote the total compute time for the per-object transfer function for all objects and inter-object transfer functions for all object pairs respectively, "source-field" is time to express each sound source in terms of incoming multipoles and "global-solve" is time to compute equivalent source strengths. At runtime, the total number of equivalent sources "# eq. srcs" (in million M), performance "eval." and storage requirement "storage" are also specified. For column, "#objs.", notation a*+b* denotes that first object has been instanced a times and second object instanced b times, but their per-object transfer function is computed only once. Offset surface generation code takes<1 sec for each object. All timings are for a single 2.80 GHz Xeon X5560 processor core.

Due to the computational overhead of the pre-computation stage, we treat band-limited sources that emit sound whose frequency range is bounded by maximum frequency $v_{max}$, for the purpose of wave simulations. The pressure is computed at regularly sampled set of frequencies in the range [0, $\sigma_{max}$] with a step size of $\Delta v$. The value of parameter $\Delta v$ is 1.9 Hz for concave, wall, rock and parallel walls benchmarks and 3.8 Hz for desert, reservoir and Christmas scene.

Handling ground reflections To handle ground reflections, we assume the ground to be an infinite plane. Similar to the image source method [Allen and Berkley 1979], we reflect our equivalent sources about the ground plane and multiply their source strengths by the reflection coefficient of the ground. Since sound waves traveling in air maintain their phase upon reflection from a hard surface, we do not need to invert the strengths of the equivalent sources.

Spectral Extrapolation The band-limited nature of the frequency responses of our technique necessitates a plausible extrapolation to higher frequencies at runtime. Simply replicating the spectrum maintains temporal peak structure, but results in audible comb filter artifacts. Instead, we observe that typical edge diffraction spectra are roughly linear on a logarithmic scale. Hence, we first estimate a trend-line by a least-squares fit to the maxima of the log magnitude spectrum, and adjust for the trend to create a flat response by multiplying with the inverse of the trend on a linear scale. This adjusted response is replicated to higher frequencies and then multiplied by the trend (for all frequencies), yielding the final wide-band spectrum. If the trend-line has positive slope, indicating a high-pass response, we flatten the trend-line for frequencies beyond $v_{max}$. This extrapolation step exactly preserves the spectrum up to $v_{max}$.

Real-Time Auralization We have integrated our technique with Valve's Source engine. Audio is rendered using FMOD, and is processed in frames of 1024 audio samples, at a sampling rate of 44.1 kHz. In-game ("dry") audio clips are pre-processed by computing a windowed short-time Fourier transform (STFT) on each frame (Blackman window). The STFTs are computed on audio frames after zero-padding by the maximum IR length to prevent aliasing artifacts. Real-time auralization is performed using overlap-add STFT convolutions. In each rendered frame, the dry audio frame for each source is convolved (multiplied in the frequency-domain) with the corresponding IR. The results are then mixed, and an inverse FFT performed on the mixed audio. Finally, overlap from previous frames is added in, and overlap from the current frame is cached in a ring buffer. Binaural sound rendering is achieved by using two virtual listeners, one for each ear.

6 Results and Analysis

In this section, we present the results of our technique on different benchmarks, provide detailed error analysis and compare it with prior work. See Table 4 and Appendix A.4 for the computational complexity of our approach.

TABLE 4

Computational complexity of our approach. Refer to Table 1 for meaning of each symbol and Appendix A.4 for the derivation of these expressions.

| Quantity (1 source) | Complexity (per freq) |
|---|---|
| Precompute time | $0\ (mQ\ (nP^2\ u\ \log u\ mPnQ)\ m^3P^3)$ |
| Runtime compute | $0\ (mP)$ |
| Runtime memory | $11\ mP$ |

6.1 Benchmarks

We have considered a variety of scenes for testing our technique. For auralizations corresponding to all the benchmarks discussed below, kindly refer to the supplementary video.

Figure 4A:
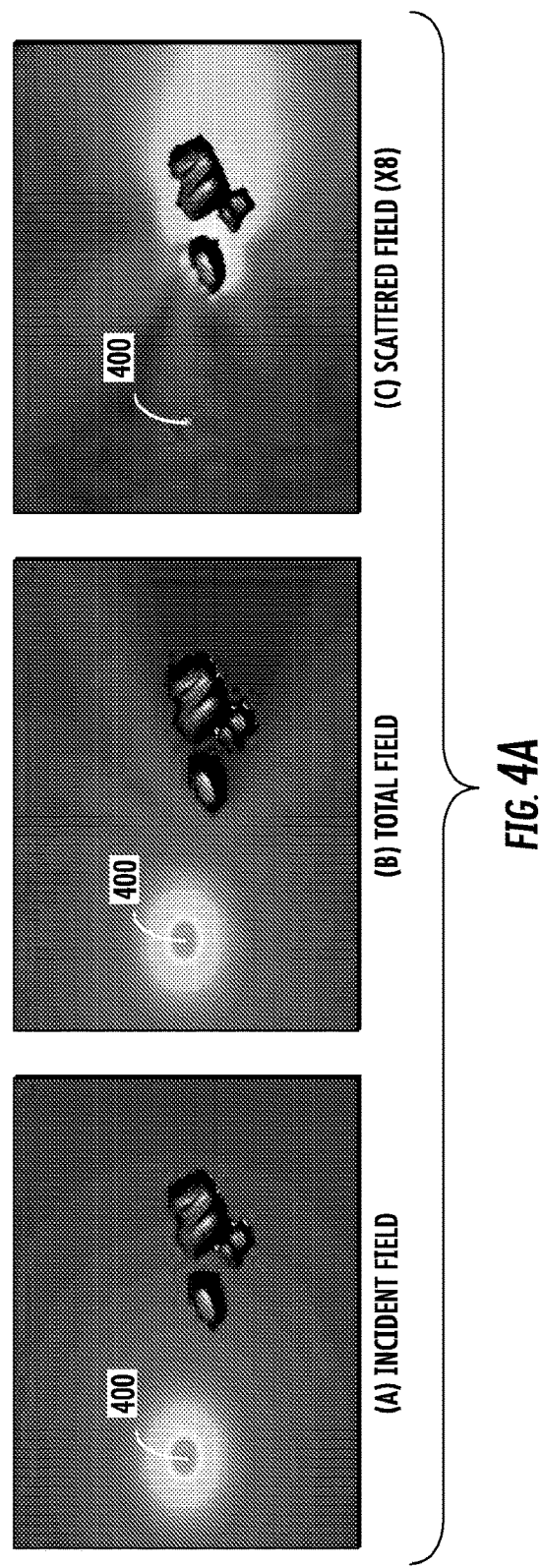
FIG. 4A illustrates a pressure field at 170 Hz in a simple scene with a single object (rocks) and a single sound source (dot 400). The difference between total and incident fields is the scattered field (scaled 8 times for visualization). Note the high amplitude of the scattered field between the rocks representing the large difference in incident and total field resulting from diffracted occlusion.
Figure 4B:
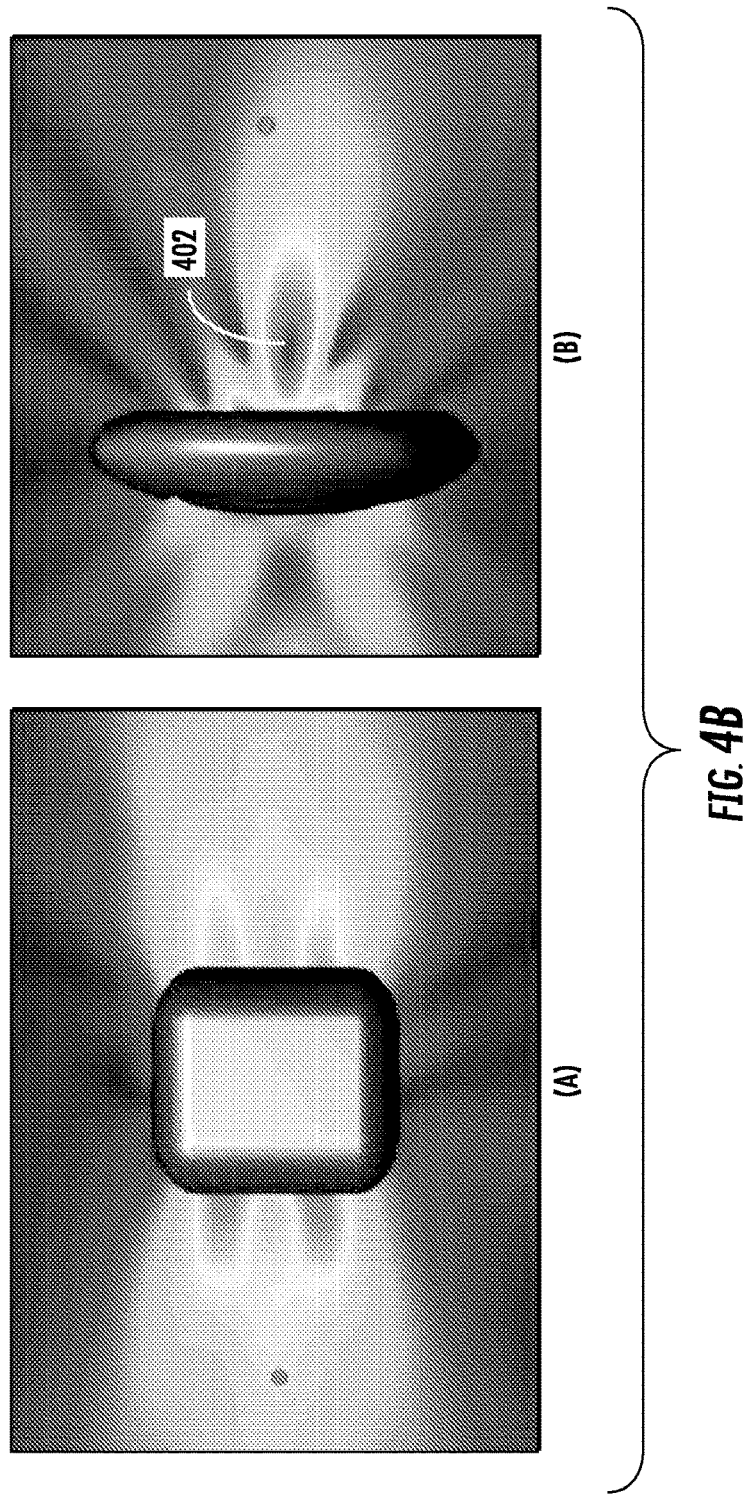
FIG. 4B illustrates the magnitude scattered sound field at 163 Hz from the wall.

Single Object We considered various objects which have different scattering characteristics to test our technique—rocks, a wall, and a concave reflector. The rocks scatter sound in all directions (FIG. 4A). Referring to FIG. 4B, panel (a), we show the magnitude scattered sound field at 163 Hz from the wall, with the sound source shown with the dark dot. It is visible that the wall strongly reflects sound back to the source. As a more challenging benchmark, the magnitude scattered sound field for a concave reflector at 163 Hz is shown in FIG. 4B, panel (b). The reflector generates significant interference effects, resulting in caustic formation in the focal region. This is clearly captured by our technique, as the dark, amplitude region labeled 402 in the figure, showing that our technique is able to approximate the phase of the scattered wave field with reasonable accuracy.
Parallel Buildings This scene consists of two buildings situated parallel to one another. We show two walkthroughs of this scene, with a flying helicopter, and a person speaking, respectively. As the helicopter moves behind a building, diffraction leads to a distinct low-passed occlusion effect. The two walls trap sound between them as high order reflections (see FIG. 7 for field visualizations), so that the loudness of someone talking between the buildings is markedly louder than someone standing even slightly to the side.
Desert This is a large scene with three different sound sources spread throughout the scene—a jeep, a bird, and a radio. As the listener walks through the scene, the received sound from the various sources changes significantly depending on whether or not the listener is in line-of-sight of the source(s). We also specifically demonstrate the effect of second-order diffracted occlusion of the jeep sound around two buildings.
Christmas Town This scene demonstrates sound propagation in a village with many houses, a church, a bell tower and large buildings. This benchmark shows diffraction around buildings, sound propagation over large distances from the bell tower, reflections between two parallel buildings, for multiple sources.
Reservoir We show that our technique can be integrated with an existing game (Half-Life 2) to generate realistic wave acoustic effects in a large outdoor game map. Ours is the first wave-based sound propagation technique which can accurately model wave phenomena such as diffraction behind the rocks and scattering around buildings over large distances on such a scene in real-time.

6.2 Error Analysis

Figure 5:
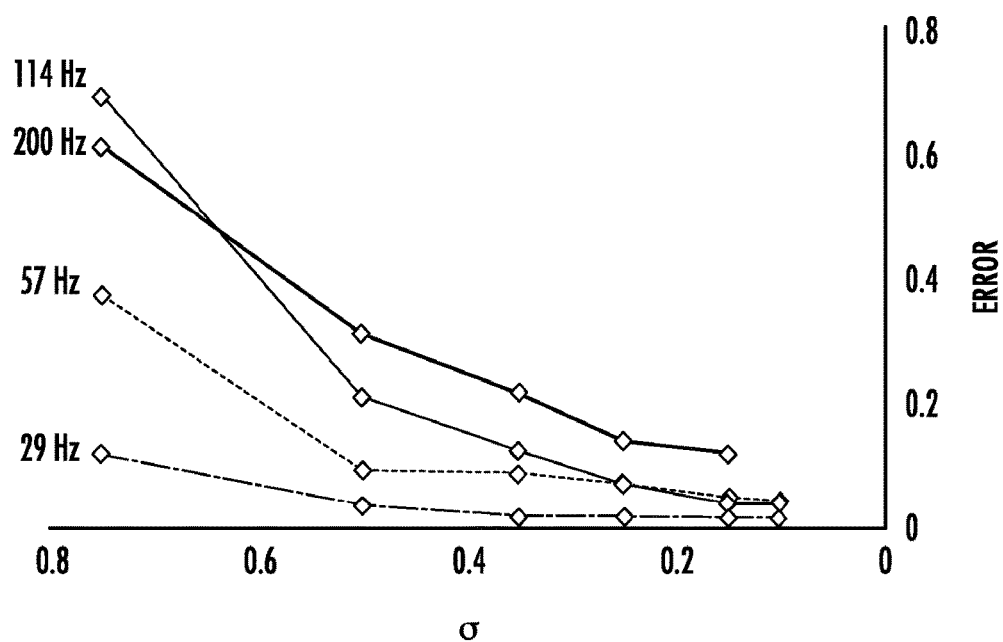
FIG. 5 is a graph illustrating the variation of error=$\|P_{ref}-P_{ESM}\|^2/\|P_{ref}\|^2$ between the pressure fields of the reference wave solver and our technique for varying values of a (scattering matrix error threshold) for the two walls case (fixed $\eta=1\%$).
Figure 6:
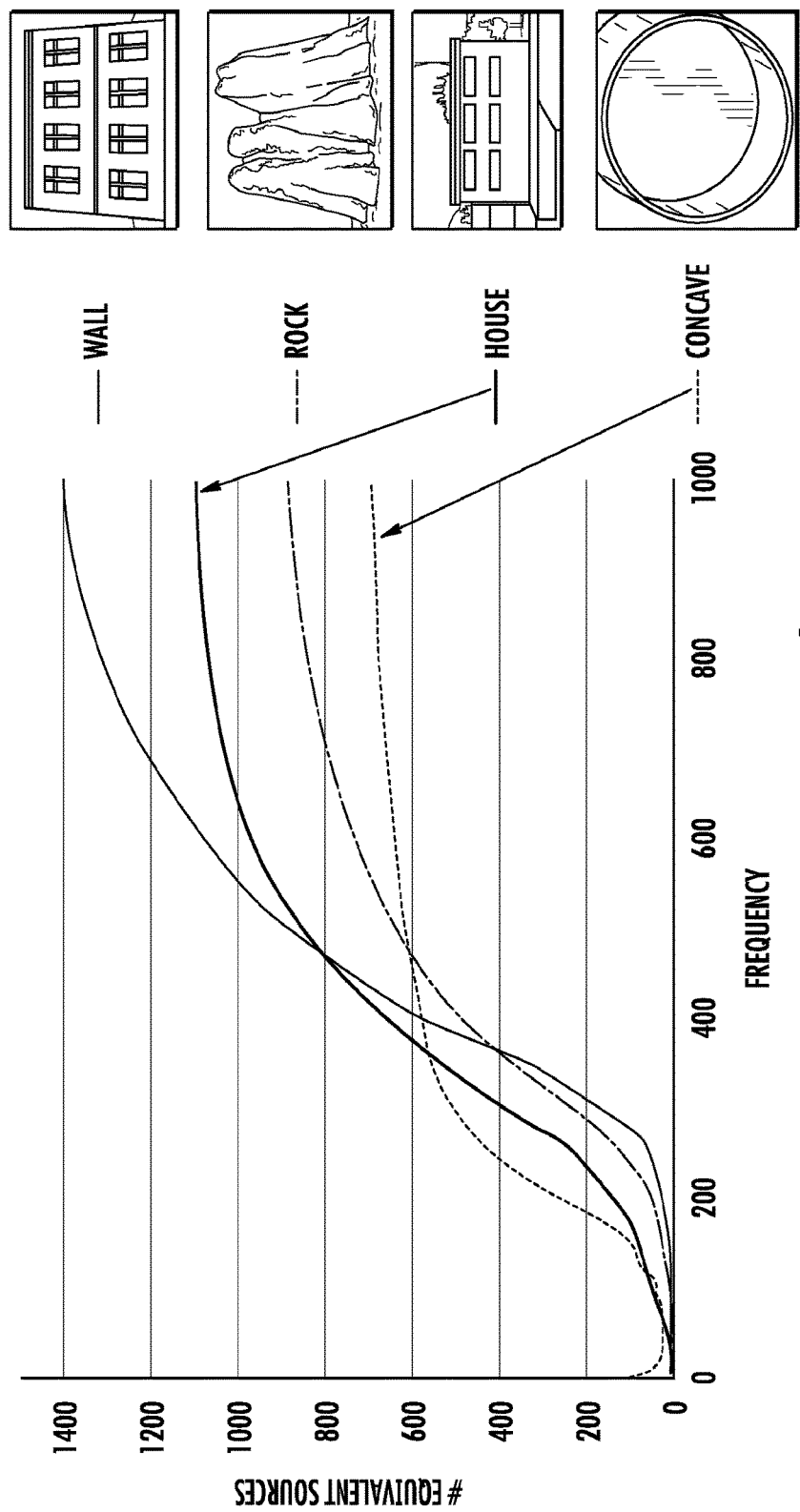
FIG. 6 is a graph illustrating the variation of number of outgoing equivalent sources with frequency for four different objects. As the frequency increases (wavelength decreases), surface details of size of wavelength start increasing the complexity of the sound field. This results in larger number of equivalent sources. When all the details of the object are captured, increasing the frequency has little effect and the number of equivalent sources start to stabilize. Error thresholds used were $\sigma=15\%$ and $\eta=1\%$.

FIG. 5 shows the convergence of our method as the scattering matrix error threshold decreases. We also plot the variation in the number of equivalent sources with frequency (see FIG. 6) to achieve given error thresholds. Higher frequencies require more equivalent sources to capture their spatial variation. However, after a certain point when all the details in the object have been captured, increasing the frequency results has little effect on the number of equivalent sources.

Figure 7:
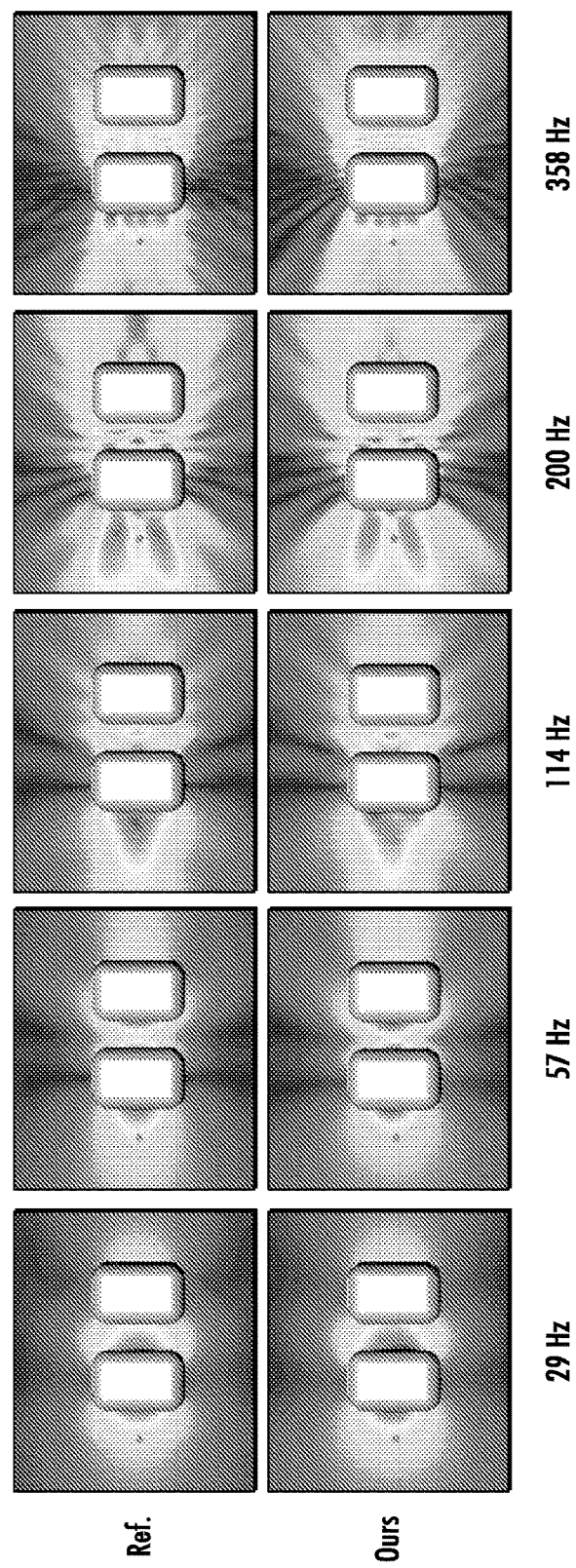
FIG. 7 is a comparison between the magnitude of the complex scattered field (||total field−incident field||) computed by the reference wave-solver (top row) and our technique (bottom row) with error thresholds $\sigma=15\%$ and $\eta=1\%$. Our technique produces good approximations while reducing memory usage by orders of magnitude (50× in this case). The dark point on the left hand side of each image denotes the position of the sound source.

FIG. 7 compares the pressure field on a spatial grid of listeners at different frequencies for the parallel buildings scene, as computed using the reference wave solver and our technique. The theoretical runtime memory requirements for different wave-solvers are discussed in the Appendix A.4. We also compare the runtime memory requirements for these solvers on our benchmark scenes (Table 5).

6.3 Comparison with Prior Interactive Techniques

Our usage of equivalent sources for sound propagation is in a similar vein to prior work [James et al. 2006], where the authors represent arbitrary outgoing radiation fields from a single geometrically complex object. Our work differs primarily in three regards: First, we model mutual interactions between objects in arbitrary scenes using inter-object transfer functions, accounting for high-order interactions such as echoes and multiple diffraction. Secondly, we model acoustic scattering from objects (as opposed to radiation), which requires an approximation of both the incoming and outgoing pressure fields for an object. Finally, our outgoing equivalent sources are chosen to satisfy multiple outgoing scattered fields as opposed to a single radiation field.

The problem of real-time acoustic scattering has been previously addressed using GPUs [Tsingos et al. 2007]. First-order scattering effects are modeled but acoustic interactions between objects cannot be modeled. In contrast, our work can handle all orders of interactions between the objects using inter-object transfer functions.

A recent technique for interactive acoustics based on wave simulation was proposed in [Raghuvanshi et al. 2010], which relies on sampling the volume of the scene and uses perceptual compression specific to indoor scenes. The runtime memory requirement of their technique on our benchmarks (assuming a spatial sampling of 1 m) is 187 MB for parallel walls and 1.8 GB for the reservoir. This technique is complementary to our approach—it works best in indoor spaces with a lot of geometric clutter but limited volume, while our technique is better suited to outdoor spaces with well-separated objects and is insensitive to air volume. In fact, it would be quite natural to integrate this method with ours, with the indoor and outdoor propagation models coupled through transport operators defined on doors and windows.

7. Conclusions and Discussion

We have presented a novel wave-based sound propagation algorithm that captures acoustic effects such as high-order diffraction and scattering using an equivalent source formulation. As a result, our technique can perform accurate sound propagation on large, open scenes in real-time, has a small memory footprint, and allows flexible efficiency-accuracy tradeoffs. Compared to directly storing and convolving wave-solver solutions for auralization, we reduce the memory usage more than 100 times.

Our approach is currently most suitable for static scenes, due to the computational cost of recomputing inter-object transfers as objects move. Our approach can be combined with Fast Multipole Method (FMM) to accelerate inter-object transfer evaluations using progressive far-field approximations. Moreover, real-time performance could be achieved by further using GPU-based dense linear solvers. The incoming field strength computation for a moving source is similar to inter-object transfer. Thus, the combination of FMM and GPU-based computations could enable dynamic sources along with a moving listener.

The complexity of our method increases linearly as a function of the frequency, and our approach is practical up to roughly 1-2 kHz depending on the scene. Geometric approximations become quite accurate for outdoor scenes at these frequencies because buildings and terrain have much larger dimensions than the wavelength of 17 cm at 2 kHz. Thus, hybridization of our technique with geometric methods could lead to accurate wide-band propagation techniques for open scenes.

A APPENDIX

A1. Mathematical Expression of Multipole Solutions

The field due to a multipole located at point $y_i$ is mathematically defined as follows—

$$\phi_{ilm}(x) = \Gamma_{lm} h_l^{(2)}(wr_i/c)\psi_{lm}(\theta_i, \phi_i) \qquad (1)$$

Where w is the angular frequency, c is the speed of sound, $(r_i, \theta_i, \phi_i)$ is the vector $(x-y_i)$ expressed in spherical coordinates, $h_l^{(2)}(wr_i/c)$ are the spherical Hankel functions of the second kind [Abramowitz and Stegun 1964], $\psi_{lm}(\theta,\phi)$ are the spherical harmonic functions [Hobson 1955] and $\Gamma_{lm}$ is the normalizing factor that makes spherical harmonics orthonormal.

A.2 Two-Object Steady State Field

We describe detail the way we computer the equivalent source strengths for a scene composed of two objects. Consider a scene with objects A and B and a sound source s. Let the incoming field multipoles at A and B be $\Phi_A^{in}$ and $\Phi_B^{in}$, respectively. Similarly, let the multipoles for the outgoing field for A and B be $\Phi_A^{out}$ and $\Phi_B^{out}$, respectively. The scattering matrices for A and B are $T_A$ and $T_B$, respectively. Let the interaction matrices for the objects be $G_A^B$ and $G_B^A$ respectively. First of all, we express the incoming field produced by sound source s on objects A and B in terms of their incoming field multipoles $$s_A^{in} = \sum_{j=1}^{Q} \sum_{h=1}^{M^2} a_{jh} \varphi_{jh}^{in} = S_A^{tr} \Phi_A^{in}$$

$$s_B^{in} = \sum_{j=1}^{Q} \sum_{h=1}^{M^2} b_{jh} \varphi_{jh}^{in} = S_B^{tr} \Phi_B^{in}$$

Now assume that the steady state outgoing field of object A and B is $P_A^{out}$ and $P_B^{out}$ respectively.

$$P_A^{out} = \sum_{i=1}^{P} \sum_{k=1}^{N^2} C_{ik}^A \varphi_{ik} = C_A^{tr} \Phi_A^{out} \quad (2)$$

$$P_B^{out} = \sum_{i=1}^{P} \sum_{k=1}^{N^2} C_{ik}^B \varphi_{ik} = C_B^{tr} \Phi_B^{out} \quad (3)$$

The outgoing field of one object becomes incoming field for the other object. Using linearity of the inter-object transfer function and equation (10) in Section 4.4, we find the incoming field produced on B due to outgoing field of A $$\hat{P}_B^{in} = g_A^B(C_A^{tr} \Phi_A^{out}),$$
$$= C_A^{tr} G_A^B \Phi_B^{in}$$

Similarly, we find the incoming field produced on A due to the outgoing field of B as $$\hat{P}_A^{in} = g_B^A(C_B^{tr} \Phi_B^{out}),$$
$$= C_B^{tr} G_B^A \Phi_A^{in}$$

The total incoming field on object A is given by, $$P_{in}^A = s_A^{in} + \hat{P}_A^{in} \quad (4)$$
$$= S_A^{tr} \Phi_A^{in} + C_B^{tr} G_B^A \Phi_A^{in} \quad (5)$$

Similarly, for object B, $$P_{in}^B = s_B^{in} + \hat{P}_B^{in} \quad (6)$$
$$= S_B^{tr} \Phi_B^{in} + C_A^{tr} G_A^B \Phi_B^{in} \quad (7)$$

Applying linearity of per-object transfer function f and using equation (6) in section 4.3, we get outgoing pressure $P_{out}^A$ and $P_{out}^B$ due to the scattering of incoming fields by the objects as—

$$P_A^{out} = f(P_{in}^A), \quad (8)$$
$$= S_A^{tr} T_A + C_B^{tr} G_B^A T_A) \Phi_A^{out}$$

$$P_B^{out} = f(P_{in}^B), \quad (9)$$
$$= S_B^{tr} T_B + C_A^{tr} G_A^B T_B) \Phi_B^{out}$$

In steady state, this outgoing pressure should match the outgoing pressure we started with. Equating 8 with 2, we get—

$$C_A^{tr} \Phi_A^{out} = S_A^{tr} T_A + C_B^{tr} G_B^A T_A) \Phi_A^{out}$$

$$C_A^{tr} = S_A^{tr} T_A + C_B^{tr} G_B^A T_A)$$

Similarly, equating 9 with 3, we get $$C_B^{tr} = S_B^{tr} T_B + C_A^{tr} G_A^B T_B$$

Combining above two equations into a single equation and rearranging, we get $$\begin{bmatrix} C_A \\ C_B \end{bmatrix} = \begin{bmatrix} T_A^{tr} & 0 \\ 0 & T_B^{tr} \end{bmatrix} \left( \begin{bmatrix} 0 & (G_B^A)^{tr} \\ (G_A^B)^{tr} & 0 \end{bmatrix} \begin{bmatrix} C_A \\ C_B \end{bmatrix} + \begin{bmatrix} S_A \\ S_B \end{bmatrix} \right)$$

In other words, $$\breve{C} = \breve{T}(\breve{G}\breve{C} + \breve{S}) \quad (10)$$

Rearranging, $$(I - \breve{T}\breve{G})\breve{C} = \breve{T}\breve{S} \quad (10)$$

which is linear system Ax=b. At run-time, the outgoing scattered field at any listener position x is given by—

$$p(x) = C_A^{tr} \Phi_{A_j}^{out}(x) + C_B^{tr} \Phi_{A_j}^{out}(x) \quad (12)$$

The complete pressure field becomes $$p(x) = C_A^{tr} \Phi_{A_j}^{out}(x) + C_B^{tr} \Phi_{A_j}^{out}(x) \quad (13)$$

A.3 Multiple Objects Steady State Field

For a scene with m objects, $A_1, A_2, \ldots, A_m$, equation (11) remains the same except the vectors and matrices are generalized for m objects, $$(I - \breve{T}\breve{G})\breve{C} = \breve{T}\breve{S} \quad (14)$$

where $$\breve{S} = \begin{bmatrix} S_{A_1} \\ S_{A_2} \\ \vdots \\ \vdots \\ S_{A_m} \end{bmatrix}, \breve{C} = \begin{bmatrix} C_{A_1} \\ C_{A_2} \\ \vdots \\ \vdots \\ C_{A_m} \end{bmatrix},$$

-continued $$\ddot{T} = \begin{bmatrix} T_{A_1}^{tr} & 0 & \vdots & \vdots & 0 \\ 0 & T_{A_2}^{tr} & 0 & \vdots & \vdots \\ \vdots & \vdots & \vdots & \vdots & \vdots \\ \vdots & \vdots & \vdots & 0 & T_{A_m}^{tr} \end{bmatrix}$$

and $$\ddot{G} = \begin{bmatrix} (0 & & \vdots & \vdots & \\ (G_{A_1}^{A_2})^{tr} & (G_{A_2}^{A_1})^{tr} & \vdots & \vdots & (G_{A_m}^{A_1})^{tr} \\ \vdots & 0 & \vdots & \vdots & (G_{A_m}^{A_2})^{tr} \\ (G_{A_1}^{A_m})^{tr} & (G_{A_2}^{A_m})^{tr} & \vdots & \vdots & \\ & & & & 0 \end{bmatrix}$$

The outgoing field at point x is $$p(x) = \sum_{j=1}^{m} C_{A_j}^{tr} \Phi_{A_j}^{out}(x) \quad (15)$$

The complete pressure field becomes $$p(x) = \sum_{j=1}^{m} C_{A_j}^{tr} \Phi_{A_j}^{out}(x) + s(x) \quad (16)$$

A.4 Computational Complexity

Consider a second with m objects. We have to computer the pressure at the listener position at regularly sampled set of frequencies in the range [$v_{min}$(usually 0), $v_{max}$] with a step of $\Delta v$. The total number of frequency samples become $v_{max}/\Delta v$. To simplify the analysis, we assume that all objects have the same number of offset surface samples n, incoming equivalent sources Q and outgoing equivalent sources P, at all frequencies. We also assume that all the objects have equal volume u.

Pre-Processing

Scattering matrix For each of the $QM^2$ incoming multipoles of an object, wave simulations are performed and a dense least-squares system of size $PN^2 \times n$ is solved to find the object's scattering matrix. The cost for each simulation is u log u, and the cost of solving the least-squares system[1] is $nP^2N^4$. Hence the total cost is O ($mQM^2(nP^2N^4 + u \log u)$). Interaction matrix For every pair of objects, $PN^2$ linear systems of size $QM^2 \times n$ need to be solved for finding the interaction matrix. In total, we have $m^2$ object pairs. The cost of evaluating analytical expressions for multipole pressure is O(1) each, and is dominated by the cost of solving the linear systems. Hence the total cost is O($m^2PN^2nQ^2 M^4$).

Computing strengths. The size of the final linear system for finding outgoing equivalent source strengths for all objects in response to a sound source is $mPN^2 \times mPN^2$; solving it takes O($m^3P^3N^6$) time.

The above steps are performed for all the frequency samples. The total pre-processing cost thus scales as:

$$O((mQM^2(nP^2N^4 + \mu \log \mu + mPN^2nQM^2) + m^3P^3N^6)$$
$$v_{max}/\Delta v)$$

Run-time At run-time, we evaluate equation (16) for all the frequencies, which takes O($mPN^2v_{max}/\Delta v$) time. The run-time memory requirement consists of positions (3 floats) and (complex-valued) strengths (2 floats) of equivalent source for all frequencies, which comes out to be $m(3P+2PN^2)v_{max}/\Delta v$.

Since the computational cost and runtime memory requirement scales adversely with the multipole order, we limit equivalent sources to monopoles and dipoles, N=2, M=2.

BEM The storage requirements of BEM depends on the total surface area of the objects in the scene S and the number of frequency samples $v_{max}/\Delta v$. Assuming BEM places s samples per wavelength (usually s=10), the number of monopoles/dipoles placed by BEM on the object's surface at frequency sample $v_i = Ss^2 v_i^2/c^2$. The total number of monopoles/dipoles for all the frequency samples is equal to $mSs^2 v_{max}^3/(c^2 \Delta v)$ where each multipole is specified by its position (3 floats) and complex amplitude (2 floats). The total memory requirement of storing the simulation results becomes $$5Ss^2 v_{max}^3/(c^2 \Delta v)$$

ART and FDTD The runtime memory requirements of ARD and FDTD is equal to the number of grid cells in the spatial discretization of the entire volume of the scene and the number of timestops in the simulation. Assuming volume of the scene to be V, grid size h, maximum frequency $v_{max}$, speed of sound c, and number of samples per wavelength s (equal to 3 for ARD and 10 for FDTD), we can compute the number of grid cells equal $(sv_{max}/c)^3V$. The total number of time-samples to store is at least twice the number of samples in the frequency domain. The total memory requirement of storing the simulation results for these techniques is thus $$2s^2 v_{max}^4 V/(c^3 \Delta v).$$

FIG. 8 is a block diagram of an exemplary system for simulating sound propagation within a scene in accordance with embodiments of the subject matter described herein. Referring to FIG. 8, computing platform 100 may include one or more processors 102. Computing platform 100 may also include memory 104. Memory 104 may be any non-transitory computer readable medium and may be operative to communicate with one or more of processors 102. Memory 104 may include scene decomposition module 106. In accordance with embodiments of the subject matter described herein, scene decomposition module 106 may be configured to cause processor(s) 102 to decompose a scene into disjoint objects. In some embodiments, scene decomposition module 106 may be configured to decompose the scene into the disjoint objects by computing localized regions around possible objects within the scene and classifying the possible objects as disjoint if their localized regions do not overlap.

Memory 104 may also include per-object transfer function generation module 108. In accordance with embodiments of the subject matter described herein, per-object transfer function generation module 108 may be configured to cause processor(s) 102 to generate per-object transfer functions for each of the disjoint objects, wherein each per-object transfer function maps an incoming sound field reaching an object to an outgoing sound field emanating from the object. In some embodiments, each of the per-object transfer functions maps an incoming sound field reaching its corresponding disjoint object to an outgoing sound field after accounting for sound propagation effects such as reflection, scattering, or diffraction due to the corresponding disjoint object. In some embodiments, the incoming and the outgoing sound field are expressed using equivalent sources. For example, the incoming sound field may be represented by placing the equivalent sources in an exterior region of the corresponding disjoint object and the outgoing sound field may be represented by placing the equivalent sources in an interior region of the corresponding disjoint object. In some embodiments, per-object transfer function generation module 108 may be configured to store at least one of the per-object transfer functions corresponding to one of the disjoint objects within the scene for future use in the simulation of a second scene that includes the disjoint object.

Memory 104 may further include inter-object transfer function generation module 110. In accordance with embodiments of the subject matter described herein, inter-object transfer function generation module 110 may be configured to cause processor(s) 102 to generate a plurality of inter-object transfer functions corresponding to pairs of the disjoint objects, wherein each inter-object transfer function maps an outgoing sound field emanating from one of the disjoint objects to an incoming sound filed of another of the disjoint objects. In some embodiments, each of the inter-object transfer functions maps an outgoing sound field of one of the disjoint objects to an incoming sound field of another of the disjoint objects. In some embodiments, both the incoming and the outgoing sound field are expressed in terms of equivalent sources. In some embodiments, inter-object transfer function generation module 110 may be configured to generate the plurality of inter-object transfer functions corresponding to pairs of the disjoint objects by generating an inter-object transfer function for each possible combination of the disjoint objects.

Memory 104 may further include simulation module 112. In accordance with embodiments of the subject matter described herein, simulation module 112 may be configured to cause processor(s) 102 to utilize the per-object transfer functions and the inter-object transfer functions to perform simulation of sound propagation within the scene and thereby determine a sound field for the scene. In some embodiments, simulation module 112 may be configured to utilize the per-object transfer functions and the inter-object transfer functions to perform simulation of sound propagation within the scene by computing an outgoing equivalent source strength for each of the disjoint objects within the scene. For example, simulation module 112 may be configured to utilize the outgoing equivalent source strengths for the disjoint objects to compute a pressure field corresponding to a listener position within the scene. In some embodiments, the simulation of sound propagation within the scene may be wave-based.

The subject matter described herein may be utilized for performing sound rendering or auditory displays which may augment graphical rendering and provide a user with an enhanced spatial sense of presence. For example, some of the driving applications of sound rendering include acoustic design of architectural models or outdoor scenes, walk-throughs of large computer aided design (CAD) models with sounds of machine parts or moving people, urban scenes with traffic, training systems, computer games, etc.

FIG. 9 is a flow chart of an exemplary system for sound propagation within a scene using equivalent sources according to an embodiment of the subject matter described herein. Referring to FIG. 9, in step 900, a scene is decomposed into disjoint objects. For example, as illustrated in FIG. 2, image (b), the scene may be divided into different objects. In step 902, per object transfer functions are generated for each of the disjoint objects. Each per object transfer function maps an incoming sounds field reaching an object to an outgoing sound field emanating from the object. The generation of a per object transfer function is described above in Section 4.3. In step 904, a plurality of inter-object transfer functions corresponding to pairs of the disjoint objects is generated. Each inner object transfer function maps an outgoing sound field emanating from one of the disjoint objects to an incoming sound field of another disjoint object. The generation of inter-object transfer functions is described above in Section 4.4. In step 906, the per object transfer functions and the inner object transfer functions are used to perform simulation of sound propagation within a scene and to thereby determine a sound field for the scene. As described in the exemplary implementation in Section 5 above, once the per object transfer functions and the inner object transfer functions are known, sound from different sources can be used to simulate sound propagation within a scene.

It will be understood that various details of the presently disclosed subject matter may be changed without departing from the scope of the presently disclosed subject matter. Furthermore, the foregoing description is for the purpose of illustration only, and not for the purpose of limitation.

REFERENCES

The disclosures of all of the references listed herein are hereby incorporated herein by reference in their entireties.

[1] Abramowitz, M., and Stegun, I. 1964. Handbook of Mathematical Functions, fifth ed. Dover, N.Y.

[2] ALLEN, J. B., AND BERKLEY, D. A. 1979. Image method for efficiently simulating small-room acoustics. *J. Acoust. Soc. Am* 65, 4, 943-950.

[3] ANTANI, L., CHANDAK, A., TAYLOR, M., AND MANOCHA, D. 2012. Direct-to-indirect acoustic radiance transfer. *IEEE Transactions on Visualization and Computer Graphics* 18, 2, 261-269.

[4] CHENG, A., AND CHENG, D. 2005. Heritage and early history of the boundary element method. *Engineering Analysis with Boundary Elements* 29, 3 (March), 268-302.

[5] DOICU, A., EREMIN, Y. A., AND WRIEDT, T. 2000. *Acoustic and Electromagnetic Scattering Analysis Using Discrete Sources*, 1st ed. Academic Press, July.

[6] FAIRWEATHER, G. 2003. The method of fundamental solutions for scattering and radiation problems. *Engineering Analysis with Boundary Elements* 27, 7 (July), 759-769.

[7] FUNKHOUSER, T., CARLBOM, I., ELKO, G., PINGALI, G., SONDHI, M., AND WEST, J. 1998. A beam tracing approach to acoustic modeling for interactive virtual environments. In *Proc. of ACM SIGGRAPH*, 21-32.

[8] GUMEROV, N. A., AND DURAISWAMI, R. 2009. A broadband fast multipole accelerated boundary element method for the three dimensional Helmholtz equation. *The Journal of the Acoustical Society of America* 125, 1, 191-205.

[9] Hobson, E. W. 1955. The Theory of Spherical and Ellipsoidal Harmonics. Cambridge University Press, New York, N.Y., USA.

[10] JAMES, D. L., BARBIC, J., AND PAL, D. K. 2006. Precomputed acoustic transfer: output-sensitive, accurate sound generation for geometrically complex vibration sources. *ACM Transactions on Graphics* 25, 3 (July), 987-995.

[11] KROPP, W., AND SVENSSON, P. U. 1995. Application of the time domain formulation of the method of equivalent sources to radiation and scattering problems. *Acta Acustica united with Acustica* 81, 6, 528-543.

[12] LENTZ, T., SCHRODER, D., VORLANDER, M., AND ASSENMACHER, I. 2007. Virtual reality system with integrated sound field simulation and reproduction. *EURASIP J. Appl. Signal Process.* 2007, 1, 187.

[13] LIU, Y., SHEN, L., AND BAPAT, M. 2009. Development of the fast multipole boundary element method for acoustic wave problems. 287-303.

[14] Liu, Q. H. 1997. The PSTD algorithm: A time-domain method combining the pseudospectral technique and perfectly matched layers. *The Journal of the Acoustical Society of America* 101, 5, 3182.

[15] OCHMANN, M. 1995. The source simulation technique for acoustic radiation problems. *Acustica* 81, 512-527.

[16] OCHMANN, M. 1999. The full-field equations for acoustic radiation and scattering. *The Journal of the Acoustical Society of America* 105, 5, 2574-2584.

[17] PAVIC, G. 2006. A technique for the computation of sound radiation by vibrating bodies using multipole substitute sources. *Ada Acustica united with Acustica* 92, 112-126 (15).

[18] PIERCE, A. D. 1989. *Acoustics: An Introduction to Its Physical Principles and Applications.* Acoustical Society of America.

[19] RAGHUVANSHI, N., NARAIN, R., AND LIN, M. C. 2009. Efficient and Accurate Sound Propagation Using Adaptive Rectangular Decomposition. *IEEE Transactions on Visualization and Computer Graphics* 15, 5,789-801.

[20] RAGHUVANSHI, N., SNYDER, J., MEHRA, R., LIN, M. C., AND GOVINDARAJO, N. K. 2010. Precomputed Wave Simulation for Real-Time Sound Propagation of Dynamic Sources in Complex Scenes. *SIGGRAPH 2010* 29, 3 (July).

[21] SAKAMOTO, S., USHIYAMA, A., AND NAGATOMO, H. 2006. Numerical analysis of sound propagation in rooms using the finite difference time domain method. *The Journal of the Acoustical Society of America* 120, 5, 3008.

[22] SAVIOJA, L. 2010. Real-Time 3D Finite-Difference Time-Domain Simulation of Mid-Frequency Room Acoustics. In *13th International Conference on Digital Audio Effects (DAFx-10).*

[23] SILTANEN, S., LOKK1, T., KIMINKI, S., AND SAVIOJA, L. 2007. The room acoustic rendering equation. *The Journal of the Acoustical Society of America* 122, 3 (September), 1624-1635.

[24] SVENSSON, U. P., FRED, R. I., AND VANDERKOOY, J. 1999. An analytic secondary source model of edge diffraction impulse responses. *Acoustical Society of America Journal* 106 (November), 2331-2344.

[25] TAFLOVE, A., AND HAGNESS, S. C. 2005. *Computational Electrodynamics: The Finite-Difference Time-Domain Method, Third Edition,* 3 ed. Artech House Publishers, June.

[26] TAYLOR, M. T., CHANDAK, A., ANTANI, L., AND MANOCHA, D. 2009. RE-Sound: interactive sound rendering for dynamic virtual environments. In *MM '09: Proceedings of the seventeen ACM international conference on Multimedia,* ACM, New York, N.Y. USA, 271-280.

[27] THOMPSON, L. L., AND PINSKY, P. M. 2004. *Acoustics.* John Wiley & Sons, Ltd.

[28] THOMPSON, L. L. 2006. A review of finite-element methods for time-harmonic acoustics. *The Journal of the Acoustical Society of America* 119, 3, 1315-1330.

[29] TSINGOS, N., AND GASCUEL, J. D. 1997. A general model for the simulation of room acoustics based on hierarchical radiosity. In *ACM SIGGRAPH 97,* ACM, New York, N.Y., USA, SIGGRAPH '97.

[30] TSINGOS, N., FUNKHOUSER, T., NGAN, A., AND CARLBOM, I. 2001. Modeling acoustics in virtual environments using the uniform theory of diffraction. In *SIGGRAPH '01,* ACM, New York, N.Y., USA, 545-552.

[31] TSINGOS, N., DACHSBACHER, C., LEFEBVRE, S., AND DELLEPIANE, M. 2007. Instant Sound Scattering. In *Rendering Techniques (Proceedings of the Eurographics Symposium on Rendering).*

[32] TSINGOS, N. 2009. Pre-computing geometry-based reverberation effects for games. In *35th AES Conference on Audio for Games.*

[33] VORLANDER, M. 1989. Simulation of the transient and steady-state sound propagation in rooms using a new combined ray-tracing/image-source algorithm. *The Journal of the Acoustical Society of America* 86, 1, 172-178.

[34] WATERMAN, P. C. 2009. T-matrix methods in acoustic scattering. *The Journal of the Acoustical Society of America* 125, 1, 42-51.

[35] YEE, K. 1966. Numerical solution of initial boundary value problems involving Maxwell's equations in isotropic media. *IEEE Transactions on Antennas and Propagation* 14, 3 (May), 302-307.

[36] ZIENKIEWICZ, O. C., TAYLOR, R. L., AND NITHIARASU, P. 2006. *The finite element method for fluid dynamics,* 6 ed. Butterworth-Heinemann, Jan.

What is claimed is:

1. A method for simulating sound propagation within a scene, the method comprising:
   in a computing platform including a processor and a memory:
   using a scene decomposition module embodied in the memory, causing the processor to decompose a scene into disjoint objects;
   using a per-object transfer function generation module embodied in the memory, causing the processor to generate per-object transfer functions for each of the disjoint objects, wherein each per-object transfer function maps an incoming sound field reaching an object to an outgoing sound field emanating from the object after reflection, scattering, and diffraction due to the object itself, wherein generating the per-object transfer functions includes computing an outgoing scattered field for each object using a wave equation and a wave equation solver;
   using an inter-object transfer function generation module embodied in the memory, causing the processor to generate a plurality of inter-object transfer functions corresponding to pairs of the disjoint objects, wherein each inter-object transfer function maps an outgoing sound field emanating from one of the disjoint objects to an incoming sound field of another of the disjoint objects;
   causing the processor to compute, using the per-object transfer functions and the inter-object transfer functions, outgoing equivalent sound source strengths for each of the disjoint objects, where the outgoing equivalent sound source strengths represent a resultant sound strength emanating from an object caused by interaction of sound from a source in the scene with the object and all other objects in the scene;
   storing the outgoing equivalent sound source strengths in the memory; and
   using a simulation module embodied in the memory, causing the processor to utilize the stored outgoing equivalent sound source strengths to perform simulation of sound propagation within the scene and determine a sound pressure field for any listener position in the scene.

2. The method of claim 1 wherein decomposing the scene into the disjoint objects includes computing localized regions around possible objects within the scene and classifying the possible objects as disjoint if their localized regions do not overlap.

3. The method of claim 1 wherein each of the per-object transfer functions maps an incoming sound field reaching its corresponding disjoint object to an outgoing sound field after accounting for sound propagation effects such as reflection, scattering, or diffraction due to the corresponding disjoint object.

4. The method of claim 3 wherein both the incoming and the outgoing sound field are expressed using equivalent sources.

5. The method of claim 4 wherein the incoming sound field is represented by placing the equivalent sources in an exterior region of the corresponding disjoint object and the outgoing sound field is represented by placing the equivalent sources in an interior region of the corresponding disjoint object.

6. The method of claim 1 wherein each of the inter-object transfer functions maps an outgoing sound field of one of the disjoint objects to an incoming sound field of another of the disjoint objects.

7. The method of claim 6 wherein both the incoming and the outgoing sound field are expressed in terms of equivalent sources.

8. The method of claim 1 wherein generating the plurality of inter-object transfer functions corresponding to pairs of the disjoint objects includes generating an inter-object transfer function for each possible combination of the disjoint objects.

9. The method of claim 1 wherein the simulation of sound propagation within the scene is wave-based.

10. The method of claim 1 wherein at least one of the per-object transfer functions corresponding to one of the disjoint objects within the scene is stored for future use in the simulation of a second scene that includes the disjoint object.

11. A system for simulating sound propagation within a scene, the system comprising:
a computing platform comprising a memory and a processor;
a scene decomposition module embodied in the memory and configured to cause the processor to decompose a scene into disjoint objects;
a per-object transfer function generation module embodied in the memory and configured to cause the processor to generate per-object transfer functions for each of the disjoint objects, wherein each per-object transfer function maps an incoming sound field reaching an object to an outgoing sound field emanating from the object after reflection, scattering, and diffraction due to the object itself, wherein generating the per-object transfer functions includes computing an outgoing scattered field for each object using a wave equation and a wave equation solver;
an inter-object transfer function generation module embodied in the memory and configured to cause the processor to generate a plurality of inter-object transfer functions corresponding to pairs of the disjoint objects, wherein each inter-object transfer function maps an outgoing sound field emanating from one of the disjoint objects to an incoming sound field of another of the disjoint objects;
wherein the processor is configured to compute, using the per-object transfer functions and the inter-object transfer functions, outgoing equivalent sound source strengths for each of the disjoint objects, where the outgoing equivalent sound source strengths represent a resultant sound strength emanating from an object caused by interaction of sound from a source in the scene with the object and all other objects in the scene, and wherein the processor is configured to store the outgoing equivalent sound source strengths in the memory; and
a simulation module embodied in the memory and configured to cause the processor to utilize the stored outgoing equivalent sound source strengths to perform simulation of sound propagation within the scene and determine a sound pressure field for any listener position in the scene.

12. The system of claim 11 wherein the scene decomposition module is configured to decompose the scene into the disjoint objects by computing localized regions around possible objects within the scene and classifying the possible objects as disjoint if their localized regions do not overlap.

13. The system of claim 11 wherein each of the per-object transfer functions maps an incoming sound field reaching its corresponding disjoint object to an outgoing sound field after accounting for sound propagation effects such as reflection, scattering, or diffraction due to the corresponding disjoint object.

14. The system of claim 13 wherein both the incoming and the outgoing sound field are expressed using equivalent sources.

15. The system of claim 14 wherein the incoming sound field is represented by placing the equivalent sources in an exterior region of the corresponding disjoint object and the outgoing sound field is represented by placing the equivalent sources in an interior region of the corresponding disjoint object.

16. The system of claim 11 wherein each of the inter-object transfer functions maps an outgoing sound field of one of the disjoint objects to an incoming sound field of another of the disjoint objects.

17. The system of claim 16 wherein both the incoming and the outgoing sound field are expressed in terms of equivalent sources.

18. The system of claim 11 wherein the inter-object transfer function generation module is configured to generate the plurality of inter-object transfer functions corresponding to pairs of the disjoint objects by generating an inter-object transfer function for each possible combination of the disjoint objects.

19. The system of claim 11 wherein the simulation of sound propagation within the scene is wave-based.

20. The system of claim 11 wherein the per-object transfer function generation module is configured to store at least one of the per-object transfer functions corresponding to one of the disjoint objects within the scene for future use in the simulation of a second scene that includes the disjoint object.

21. A non-transitory computer readable medium comprising computer executable instructions that when executed by a processor of a computer control the computer to perform steps comprising:

using a scene decomposition module embodied in the non-transitory computer readable medium, causing the processor to decompose a scene into disjoint objects;

using a per-object transfer function generation module embodied in the non-transitory computer readable medium causing the processor to generate per-object transfer functions for each of the disjoint objects, wherein each per-object transfer function maps an incoming sound field reaching an object to an outgoing sound field emanating from the object after reflection, scattering, and diffraction due to the object itself, wherein generating the per-object transfer functions includes computing an outgoing scattered field for each object using a wave equation and a wave equation solver;

using an inter-object transfer function generation module embodied in the non-transitory computer readable medium, causing the processor to generate a plurality of inter-object transfer functions corresponding to pairs of the disjoint objects, wherein each inter-object transfer function maps an outgoing sound field emanating from one of the disjoint objects to an incoming sound field of another of the disjoint objects;

causing the processor to compute, using the per-object transfer functions and the inter-object transfer functions, outgoing equivalent sound source strengths for each of the disjoint objects, where the outgoing equivalent sound source strengths represent a resultant sound strength emanating from an object caused by interaction of sound from a source in the scene with the object and all other objects in the scene;

storing the outgoing equivalent sound source strengths in the non-transitory computer readable medium; and using a simulation module embodied in the non-transitory computer readable medium, causing the processor to utilize the stored outgoing equivalent sound source strengths to perform simulation of sound propagation within the scene and determine a sound pressure field for any listener position in the scene.

* * * * *